United States Patent
Chih et al.

(10) Patent No.: US 8,906,767 B2
(45) Date of Patent: Dec. 9, 2014

(54) SEMICONDUCTOR DEVICE WITH SELF-ALIGNED INTERCONNECTS

(71) Applicant: Taiwan Semiconductor Manufacturing Company, Ltd., Hsinchu (TW)

(72) Inventors: Yue-Der Chih, Hsin-Chu (TW);
Jam-Wem Lee, Zhubei (TW);
Cheng-Hsiung Kuo, Jhubei (TW);
Tsung-Che Tsai, Hsinchu (TW);
Ming-Hsiang Song, Shin-Chu (TW);
Hung-Cheng Sung, Kaohsiung (TW);
Hung Cho Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/106,100

(22) Filed: Dec. 13, 2013

(65) Prior Publication Data

US 2014/0094009 A1 Apr. 3, 2014

Related U.S. Application Data

(62) Division of application No. 13/472,890, filed on May 16, 2012, now Pat. No. 8,610,220.

(51) Int. Cl.
*H01L 21/8234* (2006.01)
*H01L 21/8238* (2006.01)
*H01L 29/423* (2006.01)
*H01L 29/36* (2006.01)

(52) U.S. Cl.
CPC ...... *H01L 21/823814* (2013.01); *H01L 29/423* (2013.01); *H01L 21/823425* (2013.01); *H01L 29/36* (2013.01)

USPC .......... 438/275; 438/217; 438/224; 257/371; 257/335; 257/392; 257/401; 257/E27.046

(58) Field of Classification Search
CPC .............. H01L 21/823214; H01L 21/823425; H01L 27/0617
USPC .......... 438/275, 217, 224; 257/371, 335, 345, 257/392, 401, E27.046
See application file for complete search history.

(56) References Cited

U.S. PATENT DOCUMENTS

| | | | |
|---|---|---|---|
| 6,991,983 B2 | 1/2006 | Shin | |
| 6,998,304 B2 | 2/2006 | Wu et al. | |
| 7,282,410 B2 | 10/2007 | Lu et al. | |
| 7,462,906 B2 | 12/2008 | Lu et al. | |
| 8,354,694 B2 * | 1/2013 | Bedell et al. | 257/192 |

(Continued)

*Primary Examiner* — Tu-Tu Ho
(74) *Attorney, Agent, or Firm* — Haynes and Boone, LLP

(57) ABSTRACT

A semiconductor device and method for fabricating a semiconductor device is disclosed. An exemplary semiconductor device includes a substrate including a metal oxide device. The metal oxide device includes first and second doped regions disposed within the substrate and interfacing in a channel region. The first and second doped regions are doped with a first type dopant. The first doped region has a different concentration of dopant than the second doped region. The metal oxide device further includes a gate structure traversing the channel region and the interface of the first and second doped regions and separating source and drain regions. The source region is formed within the first doped region and the drain region is formed within the second doped region. The source and drain regions are doped with a second type dopant. The second type dopant is opposite of the first type dopant.

20 Claims, 21 Drawing Sheets

(56) References Cited

U.S. PATENT DOCUMENTS

2002/0031888 A1 3/2002 Fang et al.
2008/0308878 A1 12/2008 Bulucea
2009/0212854 A1 8/2009 Baumgartner
2012/0001233 A1 1/2012 Lee et al.

* cited by examiner ure to perform electrical routing between the various integrated circuit devices, components, and features on the substrate and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate. In more detail, the interconnect structure may include a plurality of interconnect layers, also referred to as metal layers (e.g., M1, M2, M3, etc). Each of the interconnect layers includes a plurality of interconnect features, also referred to as metal lines. An interlayer dielectric (ILD) which may comprise a plurality of ILD layer of the interconnect structure provides isolation between the metal lines.
SEMICONDUCTOR DEVICE WITH SELF-ALIGNED INTERCONNECTS

PRIORITY DATA

The present application is a divisional application of U.S. patent application Ser. No. 13/472,890, filed May 16, 2012, which issued as U.S. Pat. No. 8,610,220, is incorporated by reference in its entirety.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of manufacturing different types of integrated circuit devices on a single substrate. However, as the scaling down continues, forming different types of integrated circuit devices on a single substrate has proved difficult. Accordingly, although existing integrated devices and methods of fabricating integrated circuit devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
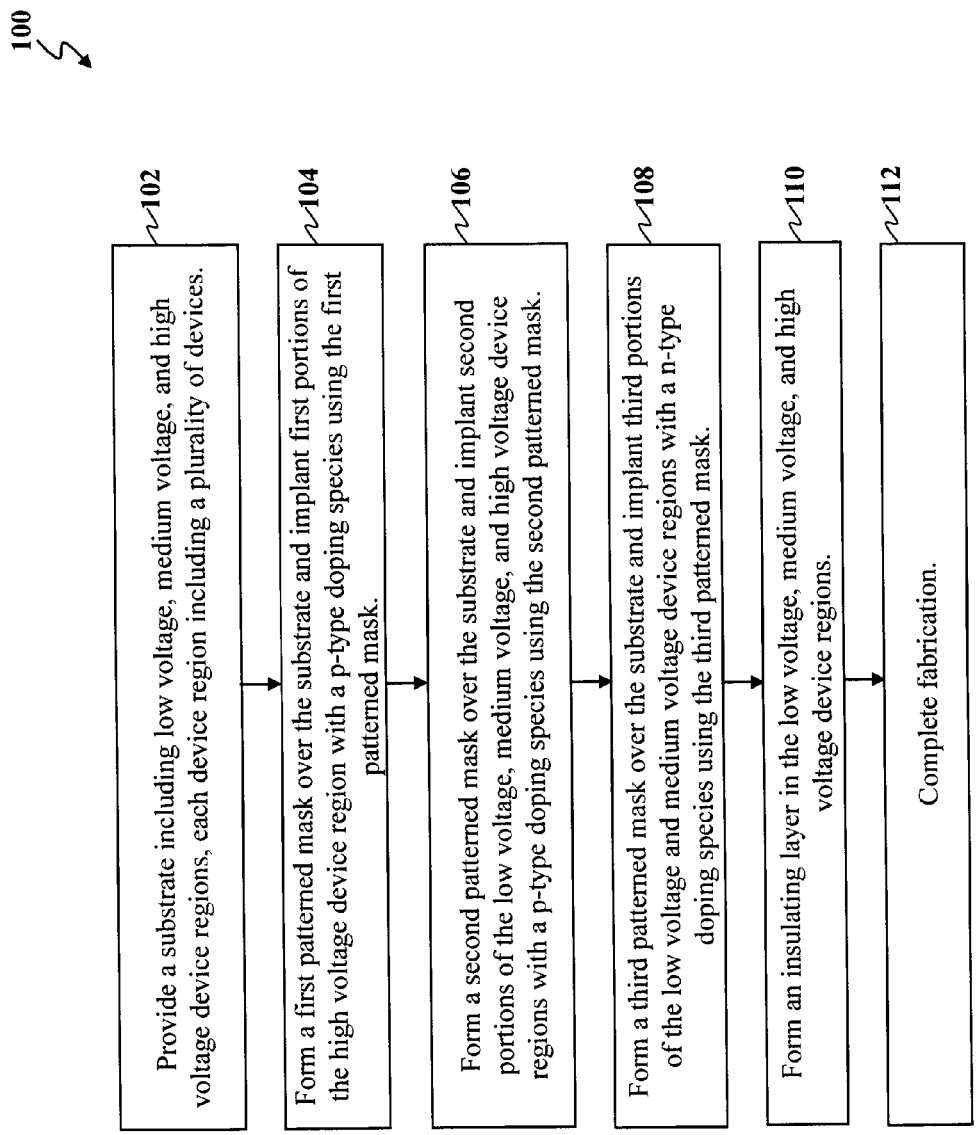
FIG. 1 is a flowchart illustrating a method of fabricating a multilayer device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Modern semiconductor devices may utilize different types of integrated circuit devices, components, and features on a single substrate. For example, the different integrated circuit devices may include low voltage devices, medium voltage devices, and high voltage devices. These devices may include n-type metal oxide field effect transformers (NMOS) devices, p-type metal oxide field effect transforms (PMOS) devices, input/output (I/O) NMOS, I/O PMOS, flash memory, etc. . . .

The semiconductor devices may utilize an interconnect structure to perform electrical routing between the various integrated circuit devices, components, and features on the substrate and to establish electrical connections with external devices. For example, an interconnect structure may include a plurality of patterned dielectric layers and interconnected conductive layers. These interconnected conductive layers provide interconnections (e.g., wiring) between circuitries, inputs/outputs, and various doped features formed in a semiconductor substrate. In more detail, the interconnect structure may include a plurality of interconnect layers, also referred to as metal layers (e.g., M1, M2, M3, etc). Each of the interconnect layers includes a plurality of interconnect features, also referred to as metal lines. An interlayer dielectric (ILD) which may comprise a plurality of ILD layer of the interconnect structure provides isolation between the metal lines.

Semiconductor devices that include low voltage, medium voltage, and high voltage device regions is disclosed. The low voltage region may include a plurality of MOS devices, the medium voltage region may include a plurality of MOS devices, and the high voltage region may include a plurality of MOS (a (HV) NMOS device and a cascade HV-NMOS device) and FLASH memory devices. According to the various aspects of the present disclosure, the HV-NMOS and cascade HV-NMOS devices are formed using a method that reduces the number of processing steps when compared to traditional methods, thereby allowing for better control of the manufacturing process and minimizing cost. For example, by processing the high voltage regions (including HV-NMOS and FLASH devices) at the same time as other regions, the number of masks required for processing may be reduced from 7 to 4. As a result, process time and mask cost can be reduced. The various aspects of such devices and methods are described in more detail below.

With reference to FIGS. 1 and 2-21, a method 100 and semiconductor device 200 and 300 are collectively described below. FIG. 1 is a flow chart of a method 100 for fabricating an integrated circuit device according to various aspects of the present disclosure. In the present embodiment, the method 100 is for fabricating a integrated circuit device. The method 100 begins at block 102 where a substrate including a substrate including low voltage, medium voltage, and high voltage device regions is provided. Each device regions includes a plurality of devices. Each device of the plurality of devices may be separated by shallow trench isolation (STI) features. At block 104, a first patterned mask is formed over the substrate and first portions of the high voltage device regions are implanted with a p-type doping species using the first patterned mask. The ion implantation process may include multiple ion implantation processes. The multiple ion implantation process may include the same or different doping species at the same or different concentration, and at the same or different energy. The method continues with block 106 where a second patterned mask is formed over the substrate and second portions of the low voltage, medium voltage, and high voltage device regions are implanted with a p-type doping species using the second patterned mask. The ion implantation process may include multiple ion implantation processes. The multiple ion implantation process may include the same or different doping species at the same or different concentration, and at the same or different energy. The method continues with block 108 where a third patterned mask is formed over the substrate and third portions of the low voltage and medium voltage device regions are implanted with a n-type doping species using the third patterned mask. The ion implantation process may include multiple ion implantation processes. The multiple ion implantation process may include the same or different doping species at the same or different concentration, and at the same or different energy. At block 110, an insulating layer is formed in the low voltage, medium voltage, and high voltage device regions. The insulating layer may be formed such that it has different thicknesses in the low voltage, medium voltage, and high voltage device regions. The method 100 continues with block 112 where fabrication of the integrated circuit device is completed. Additional steps can be provided before, during, and after the method 100, and some of the steps described can be replaced or eliminated for other embodiments of the method. The discussion that follows illustrates various embodiments of a multilayer device that can be fabricated according to the method 100 of FIG. 1.

FIGS. 2-21 illustrate diagrammatic top and cross-sectional side views of one embodiment of a semiconductor device 200 at various stages of fabrication, according to the method of FIG. 1. It is understood that the semiconductor device 200 may include various other devices and features, such as other types of transistors such as bipolar junction transistors, resistors, capacitors, diodes, fuses, etc. Accordingly, FIGS. 2-21 have been simplified for the sake of clarity to better understand the inventive concepts of the present disclosure. Additional features can be added in the semiconductor device 200 and some of the features described below can be replaced or eliminated in other embodiments of the semiconductor device 200.

Figure 2:
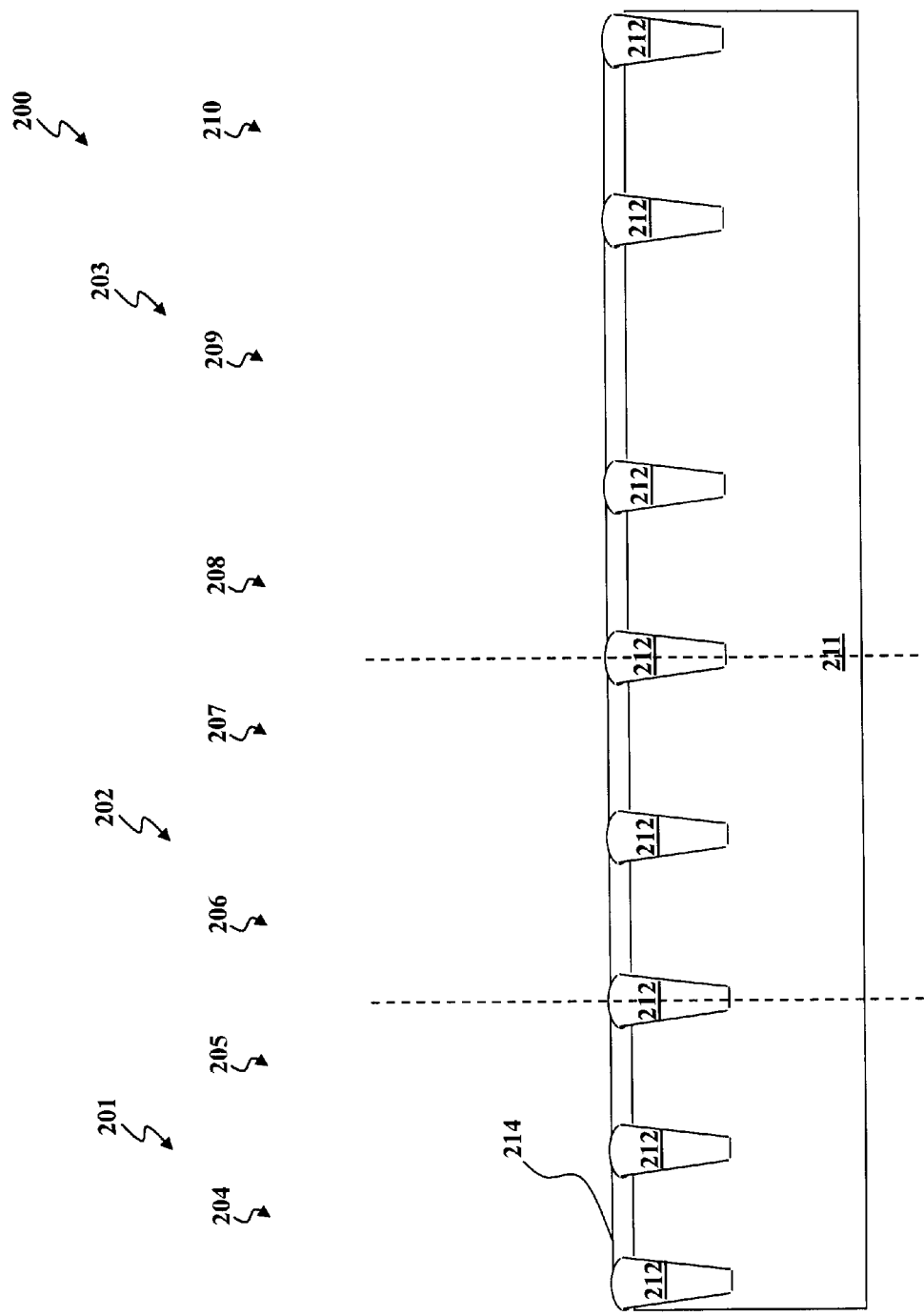
FIGS. 2-21 illustrate diagrammatic cross-sectional side views of one embodiment of a semiconductor device at various stages of fabrication, according to the method of FIG. 1.

Referring to FIG. 2, a diagrammatic cross-sectional side view of a semiconductor device is illustrated. The semiconductor device 200 includes a substrate 211. The substrate, for example, can be a bulk substrate or a silicon-on-insulator (SOI) substrate. The substrate may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The SOI substrate can be fabricated using separation by implantation of oxygen (SIMOX), wafer bonding, and/or other suitable methods. In the present embodiment, the substrate 211 is a p-type substrate. In alternative embodiments, the substrate 211 is a n-type substrate. In such embodiments, the implantation process that follow may utilize opposite type of doping species. It is understood, that although the present disclosure provides as an example a p-type substrate, the scope of the disclosure and claims should not be limited to the specific example unless expressly claimed.

Still referring to FIG. 2, the substrate 211 includes a low voltage device region 201, a medium voltage device region 202, and a high voltage device region 203. The low voltage device region 201 includes a low voltage (LV) NMOS device region 204 and a LV-PMOS device region 205. The medium voltage device region 202 includes a medium voltage (MV) PMOS device region 206 and a MV-NMOS device region 207. The high voltage device region 203 includes a high voltage (HV) NMOS device region 208, a cascade HV-NMOS device region 209, and a flash device region 210.

A plurality of shallow trench isolation (STI) features 212 formed within the substrate 211 to isolate the various devices/regions. The STI features 212 may be formed by trenching the substrate 211 and filling the trenches with an insulating material, such as silicon oxide, silicon nitride, silicon oxynitride, other suitable material, or combinations thereof. The STI features 212 may have a multi-layer structure, for example, a thermal oxide liner layer with silicon nitride filling the trench.

An insulating layer 214 is formed over the substrate 211 and over the STI features 212. The insulating layer 214 may be formed to any suitable thickness. For example, the thickness of the insulating layer 214 may range from about 50 angstroms to about 250 angstroms. In the present embodiment, the insulating layer 214 has a thickness of about 90 angstroms. The insulating layer 214 may be utilized in subsequent processing for implant screening. The insulating layer 214 may include a dielectric such as silicon oxide or any suitable material. The insulating layer 214 may be formed by any suitable process such as chemical vapor deposition (CVD), physical vapor deposition (PVD), atomic layer deposition (ALD), high density plasma CVD (HDPCVD), plating, other suitable methods, and/or combinations thereof.

Figure 3:
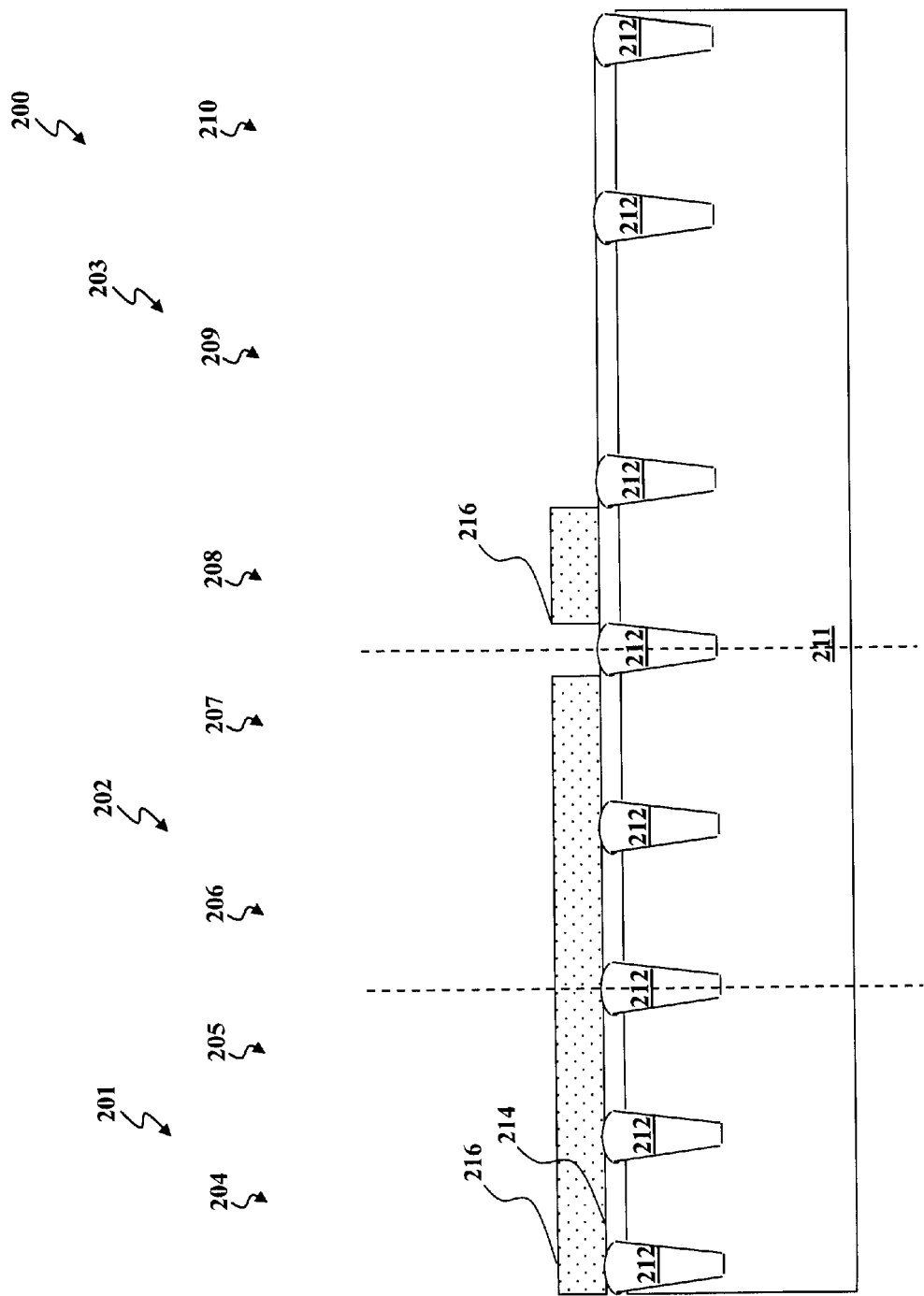

Referring to FIG. 3, a first patterned mask layer 216 is formed over the substrate 211. The first patterned mask layer 216 is formed by depositing a photoresist, performing an exposure process to define the pattern of the first patterned mask layer 216, and developing the exposed photoresist. Alternatively, the first patterned mask layer 216 may be formed by depositing a hard mask, depositing a photoresist over the hard mask, exposing the photoresist to define a pattern, developing the photoresist, and etching the hard mask with the patterned photoresist.

Figure 4:
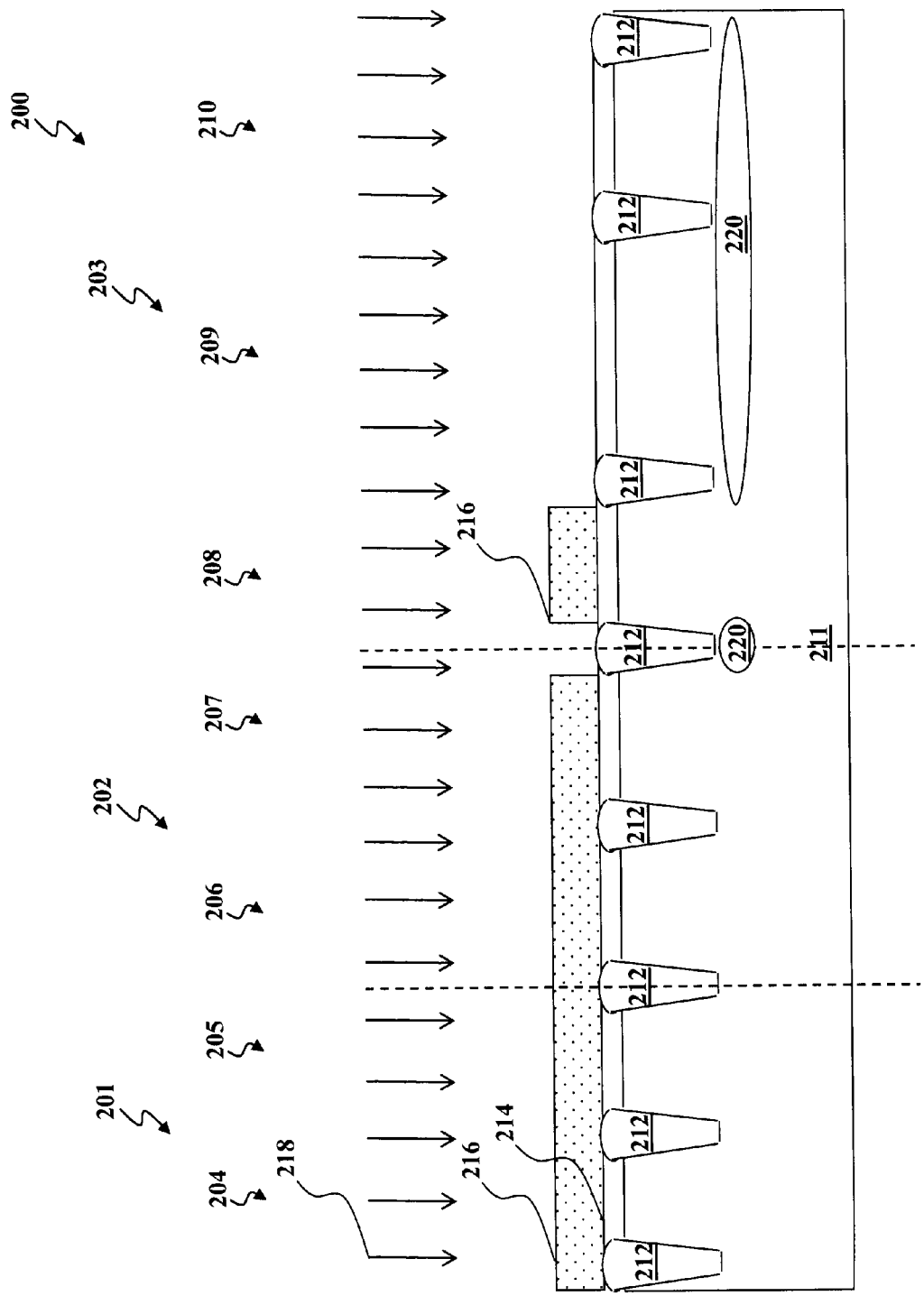

Referring to FIG. 4, an ion implantation process 218 is performed to define p-typed doped regions 220 within the substrate 211. Utilizing the first patterned mask layer 216, the ion implantation process 218 implants the substrate 211 with a p-type doping species under a STI feature 212 that borders the medium voltage device regions 202 and the high voltage device regions 203 and also implants a first portion of the high voltage device regions 203, such that p-typed doped regions 220 are formed.

Figure 5:
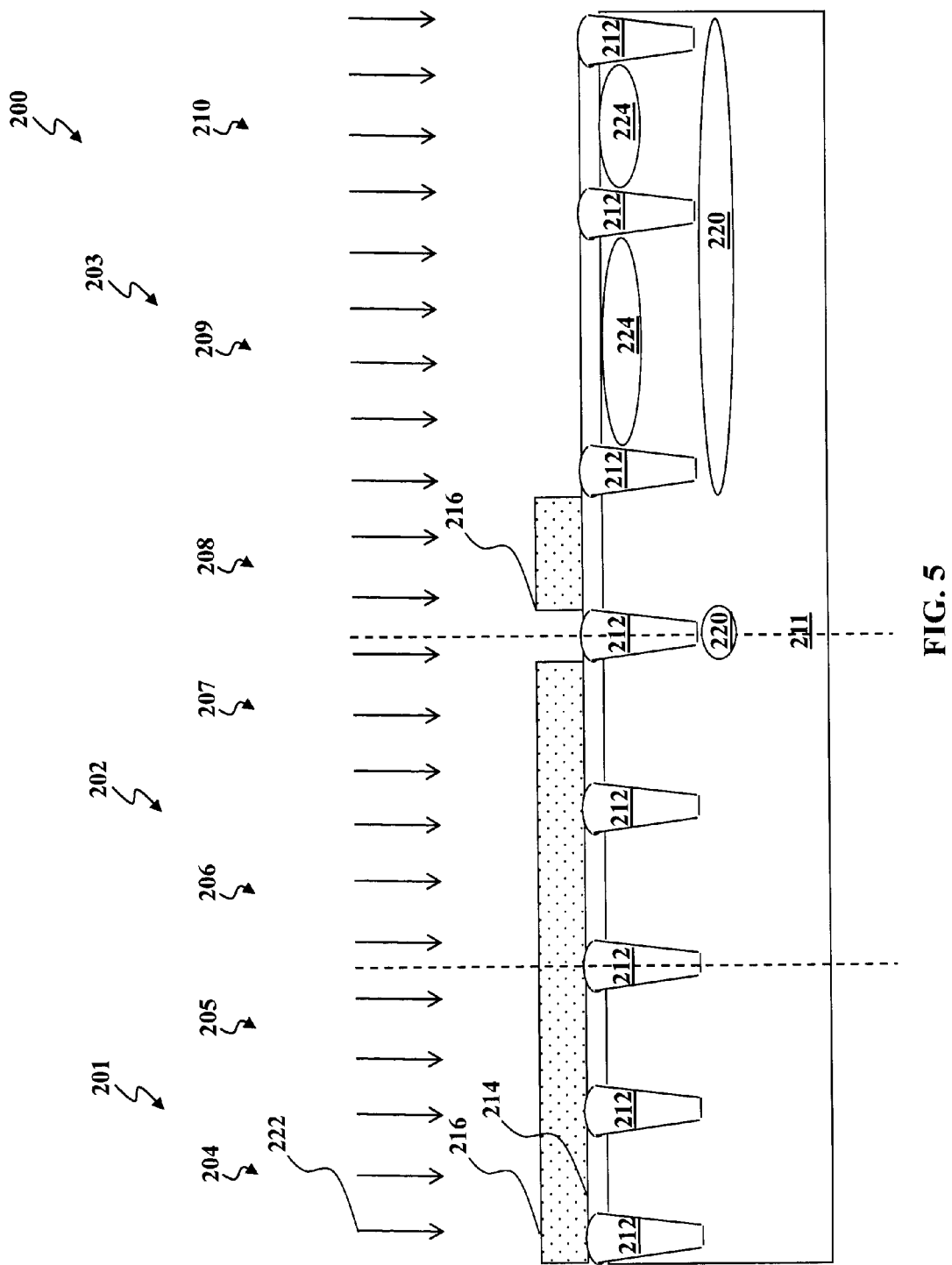

Referring to FIG. 5, an ion implantation process 222 is performed to define p-typed doped regions 224 within the substrate 211. The ion implantation process 222 also utilizes the first patterned mask layer 216 to implant the substrate 211 with a p-type doping species, thereby forming p-typed doped regions 224 in the high voltage device regions 203. As illustrated, the doped regions 224 are formed near the surface of the substrate 211 and above doped regions 220.

Figure 6:
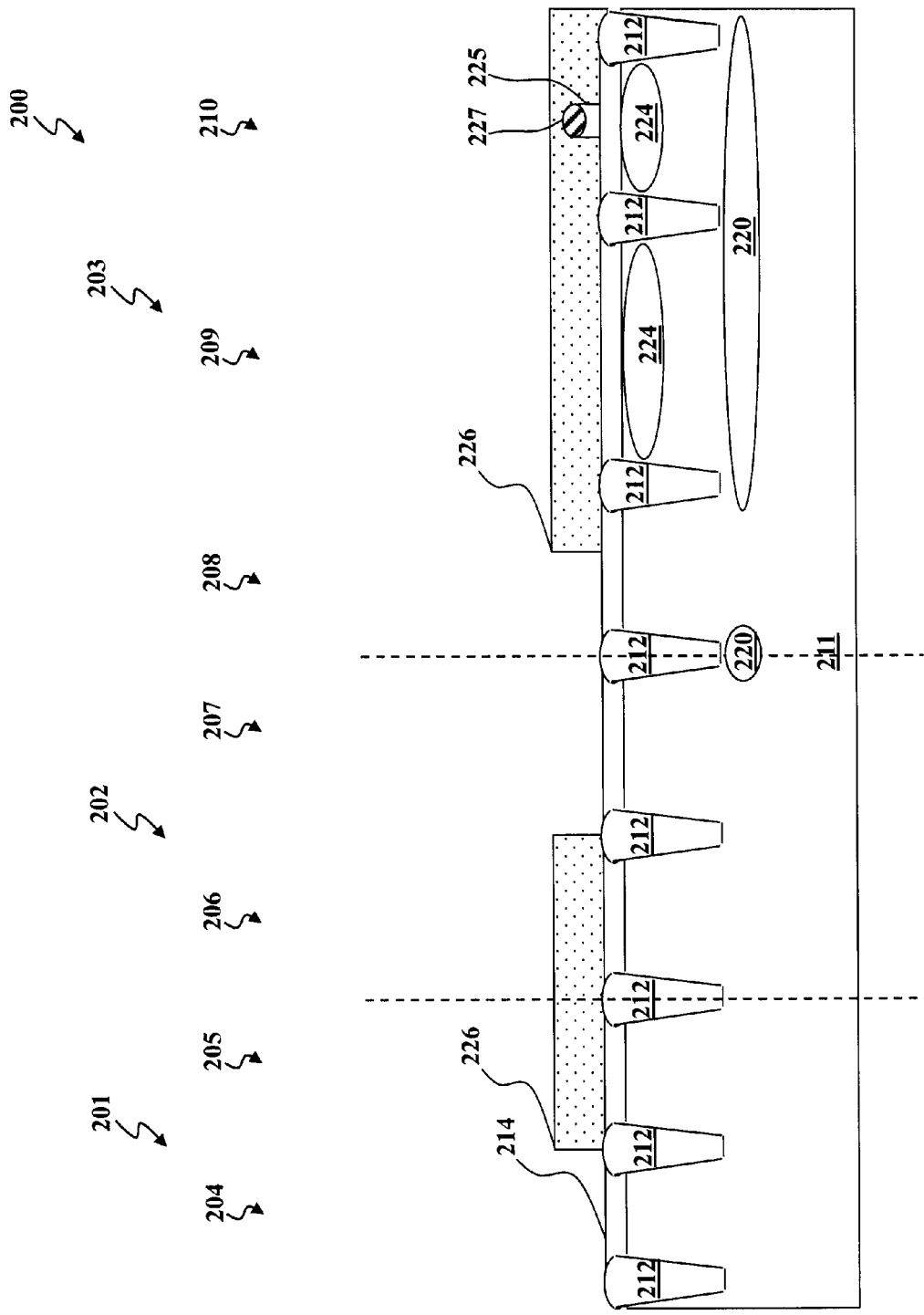

Referring to FIG. 6, the first patterned mask layer 216 is removed by any suitable process. For example, the first patterned mask layer 216 may be removed by a liquid "stripper", which chemically alters the first patterned mask layer 216 so that it no longer adheres to the insulating layer 214. Alternatively, first patterned mask layer 216 may be removed by a plasma containing oxygen, which oxidizes it, or any suitable process.

After removing the first patterned mask layer 216, a floating gate 225 of a flash device is formed over the substrate 211 in the flash device region 210 and a thick oxide 227 is formed over the floating gate 225.

After forming the floating gate 225 and the thick oxide 227, a second patterned mask layer 226 is formed over the substrate 211. The second patterned mask layer 226 is formed by depositing a photoresist, performing an exposure process to define the pattern of the second patterned mask layer 226, and developing the exposed photoresist. Alternatively, the second patterned mask layer 226 may be formed by depositing a hard mask, depositing a photoresist over the hard mask, exposing the photoresist to define a pattern, developing the photoresist, and etching the hard mask with the patterned photoresist.

Figure 7:
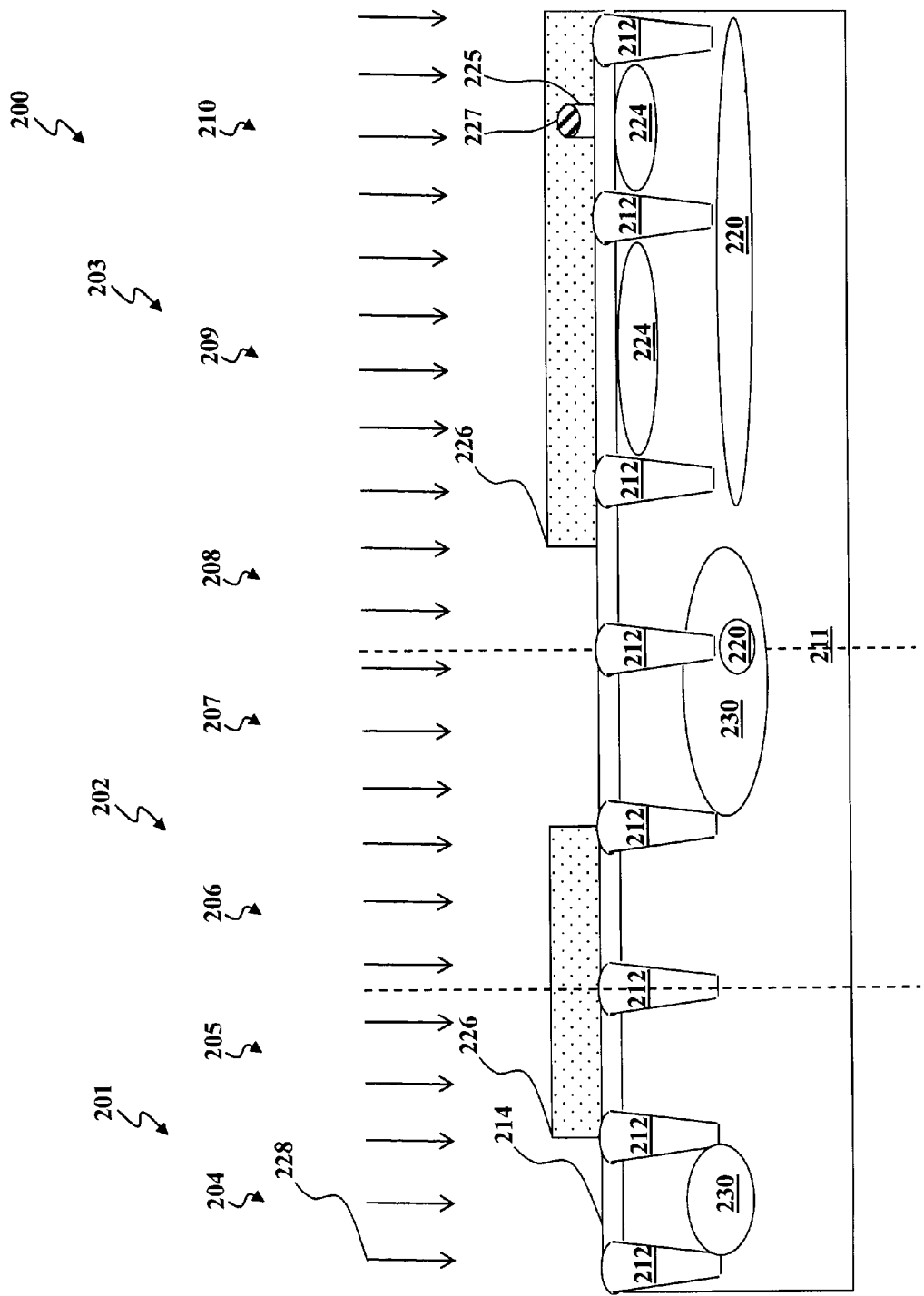

Referring to FIG. 7, an ion implantation process 228 is performed to define a core p-well regions 230 within the substrate 211. Utilizing the second patterned mask layer 226, the ion implantation process 228 implants the substrate 211 with a p-type doping species in a first portion of the low voltage device regions 201, in a first portion of the medium voltage device regions 202, and in a second portion of the high voltage device regions 203, such that core p-well regions 230 are formed.

Figure 8:
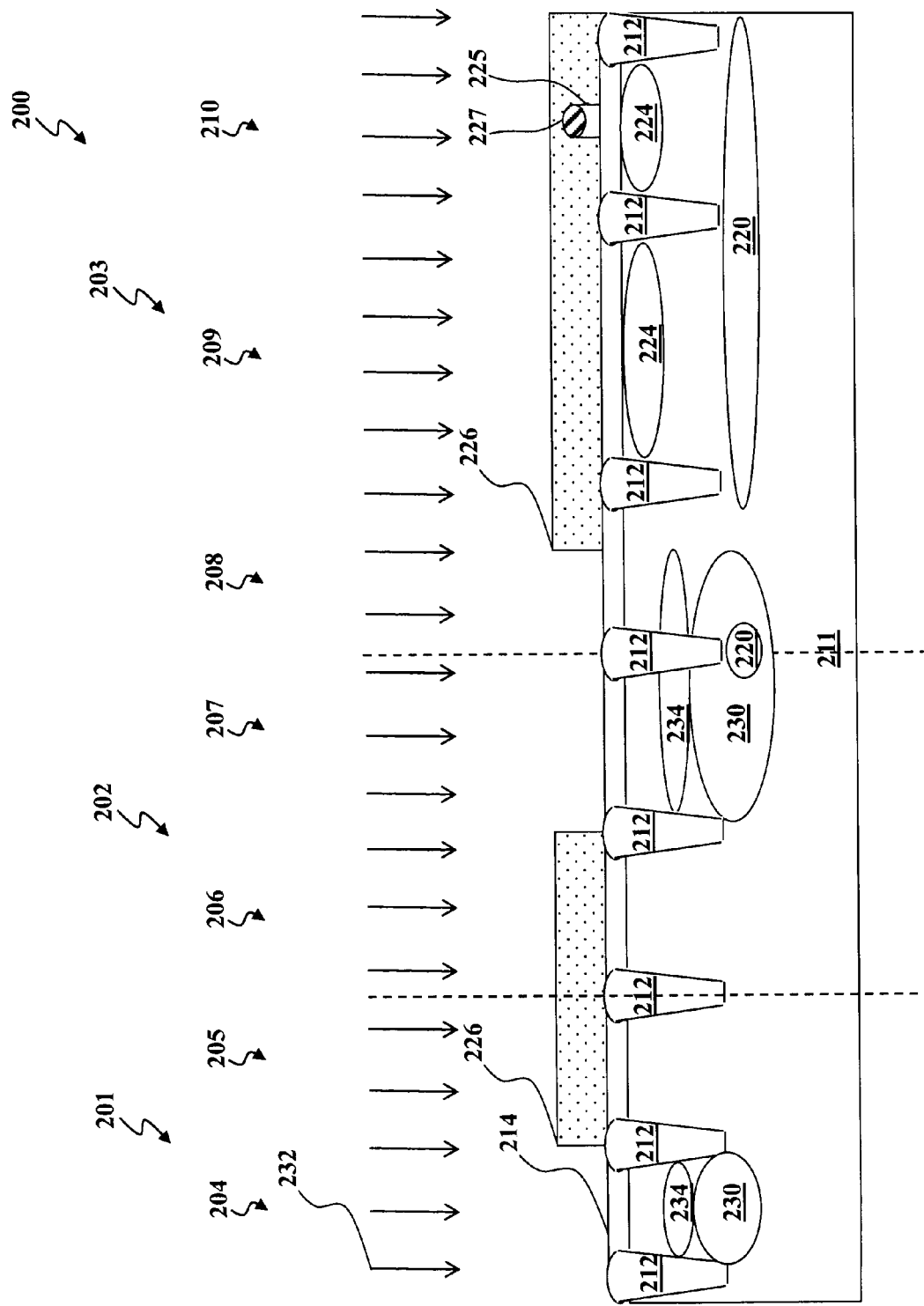

Referring to FIG. 8, an ion implantation process 232 is performed to define p-type anti-punchthrough regions 234 within the substrate 211. The ion implantation process 232 also utilizes the second patterned mask layer 226 to implant the substrate 211 with a p-type doping species, thereby forming p-type anti-punchthrough regions 234 in the first portion of the low voltage device regions 201, the first portion of the medium voltage device regions 202, and the second portion of the high voltage device regions 203.

Figure 9:
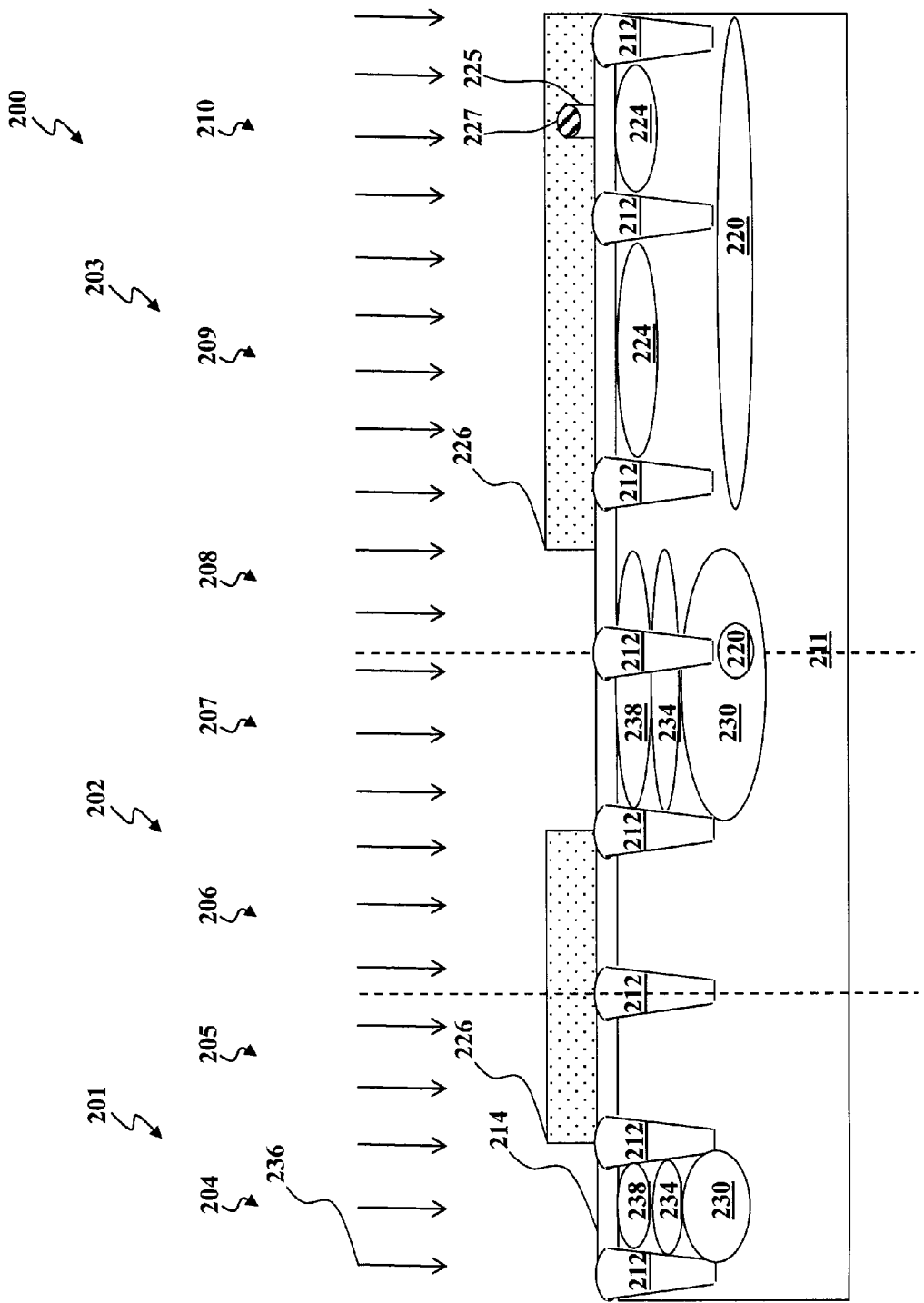

Referring to FIG. 9, an ion implantation process 236 is performed to define p-type threshold voltage regions 238 within the substrate 211. The ion implantation process 236 also utilizes the second patterned mask layer 226 to implant the substrate 211 with a p-type doping species, thereby forming p-type threshold voltage regions 238 in the first portion of the low voltage device regions 201, the first portion of the medium voltage device regions 202, and the second portion of the high voltage device regions 203.

The core p-well regions 230 have a concentration of dopant species greater than both the p-type anti-punchthrough regions 234 and the p-type threshold voltage regions 234. The p-type anti-punchthrough regions 234 have a concentration of dopant species greater than the p-type threshold voltage regions 238.

Figure 10:
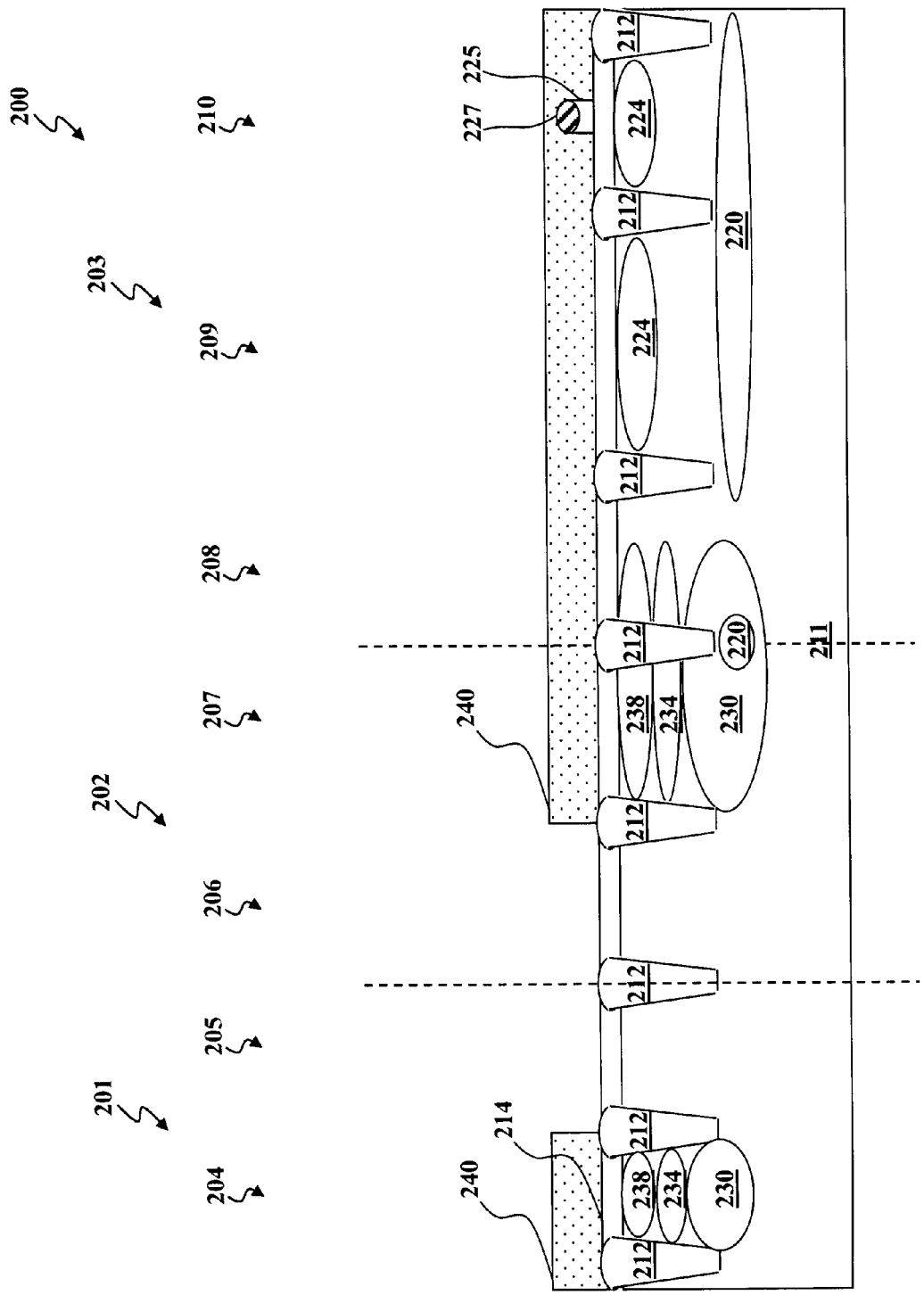

Referring to FIG. 10, the second patterned mask layer 226 is removed by any suitable process. For example, the second patterned mask layer 226 may be removed by a liquid "stripper", which chemically alters the second patterned mask layer 226 so that it no longer adheres to the insulating layer 214. Alternatively, second patterned mask layer 226 may be removed by a plasma containing oxygen, which oxidizes it, or any suitable process.

After removing the second patterned mask layer 226, a third patterned mask layer 240 is formed over the substrate 211. The third patterned mask layer 240 is formed by depositing a photoresist, performing an exposure process to define the pattern of the second patterned mask layer 240, and developing the exposed photoresist. Alternatively, the second patterned mask layer 240 may be formed by depositing a hard mask, a photoresist over the hard mask, exposing the photoresist to define a pattern, developing the photoresist, and etching the hard mask with the patterned photoresist.

Figure 11:
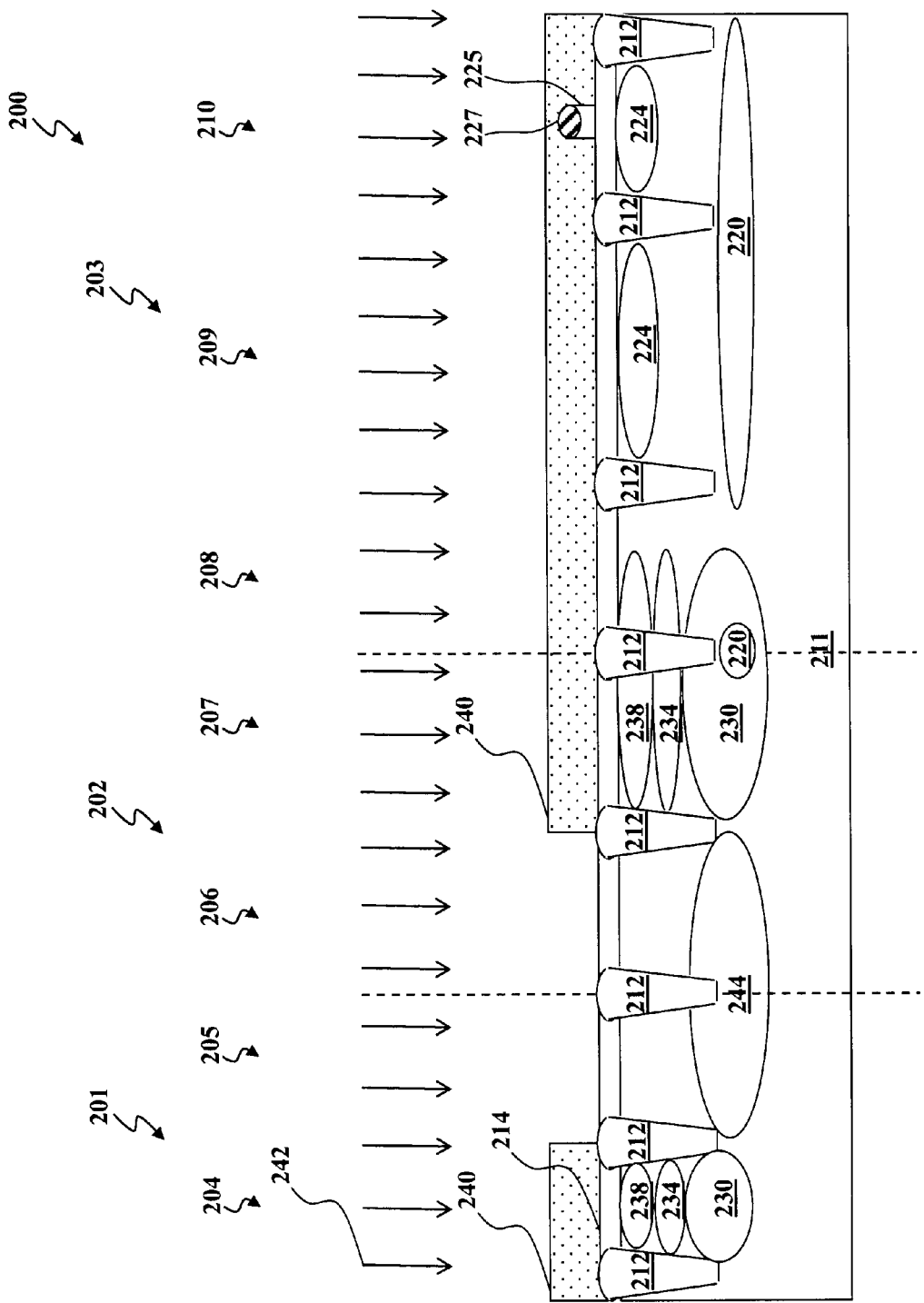

Referring to FIG. 11, an ion implantation process 242 is performed to define a core n-well regions 244 within the substrate 211. Utilizing the third patterned mask layer 240, the ion implantation process 242 implants the substrate 211 with a n-type doping species in a second portion of the low voltage device regions 201 and in a second portion of the medium voltage device regions 202, such that core n-well regions 244 are formed.

Figure 12:
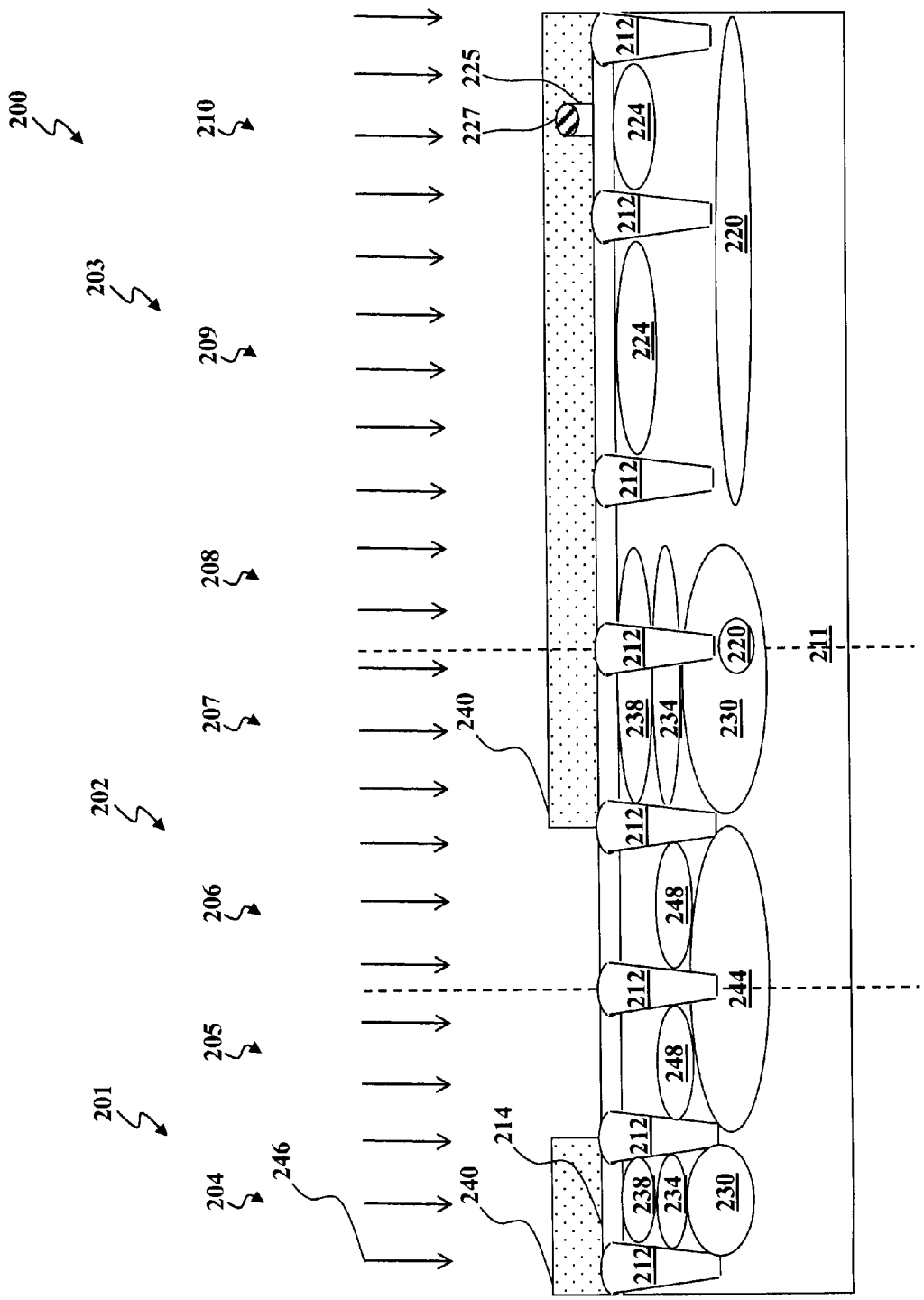

Referring to FIG. 12, an ion implantation process 246 is performed to define n-type anti-punchthrough regions 248 within the substrate 211. The ion implantation process 246 also utilizes the third patterned mask layer 240 to implant the substrate 211 with a n-type doping species, thereby forming n-type anti-punchthrough regions 248 in the second portion of the low voltage device regions 201 and in the second portion of the medium voltage device regions 202.

Figure 13:
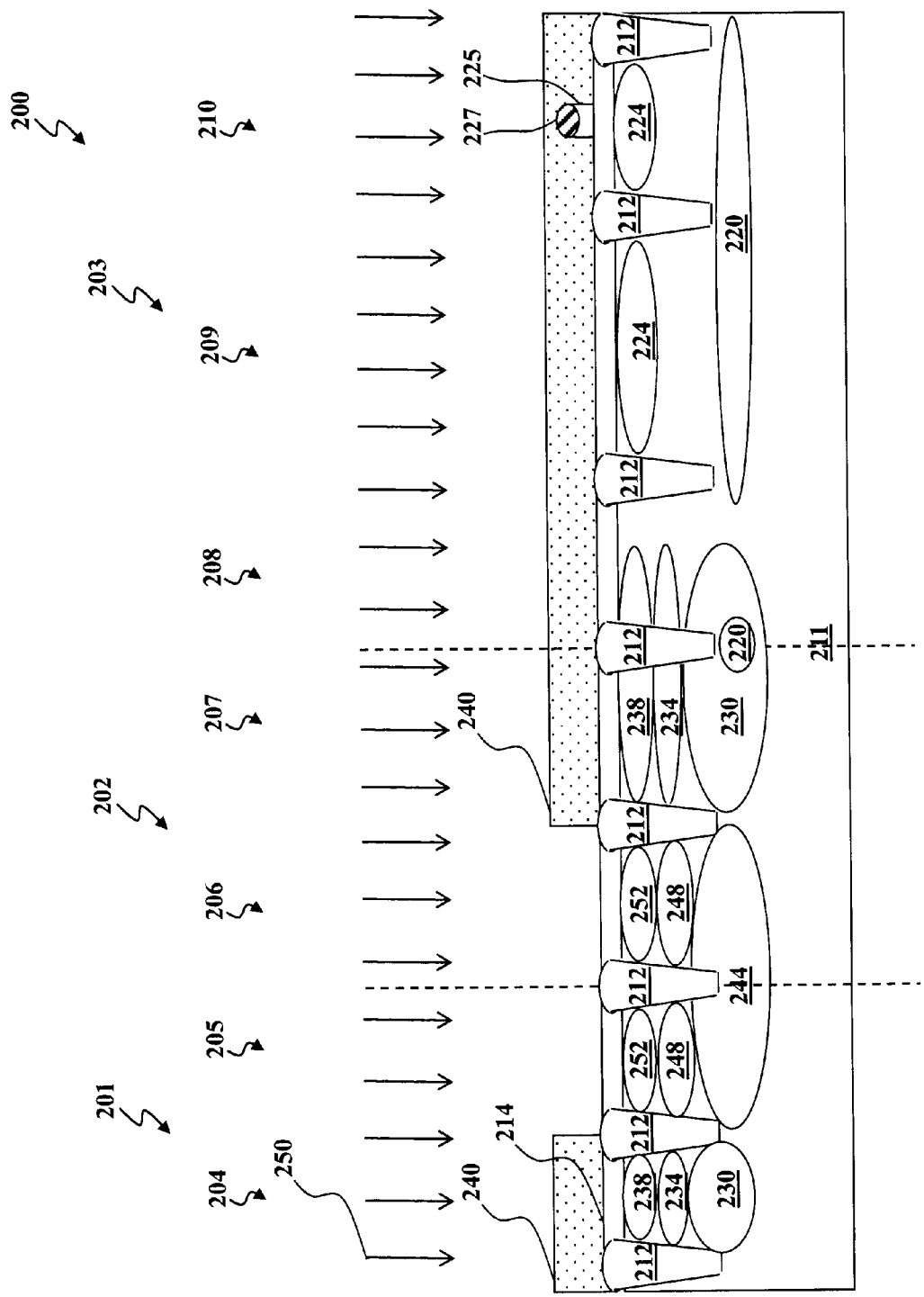

Referring to FIG. 13, an ion implantation process 250 is performed to define n-type threshold voltage regions 252 within the substrate 211. The ion implantation process 250 also utilizes the third patterned mask layer 240 to implant the substrate 211 with a n-type doping species, thereby forming n-type threshold voltage regions 252 in the second portion of the low voltage device regions 201 and in the second portion of the medium voltage device regions 202.

The core n-well regions 244 have a concentration of dopant species greater than both the n-type anti-punchthrough regions 248 and the n-type threshold voltage regions 252. The n-type anti-punchthrough regions 248 have a concentration of dopant species greater than the n-type threshold voltage regions 252.

Figure 14:
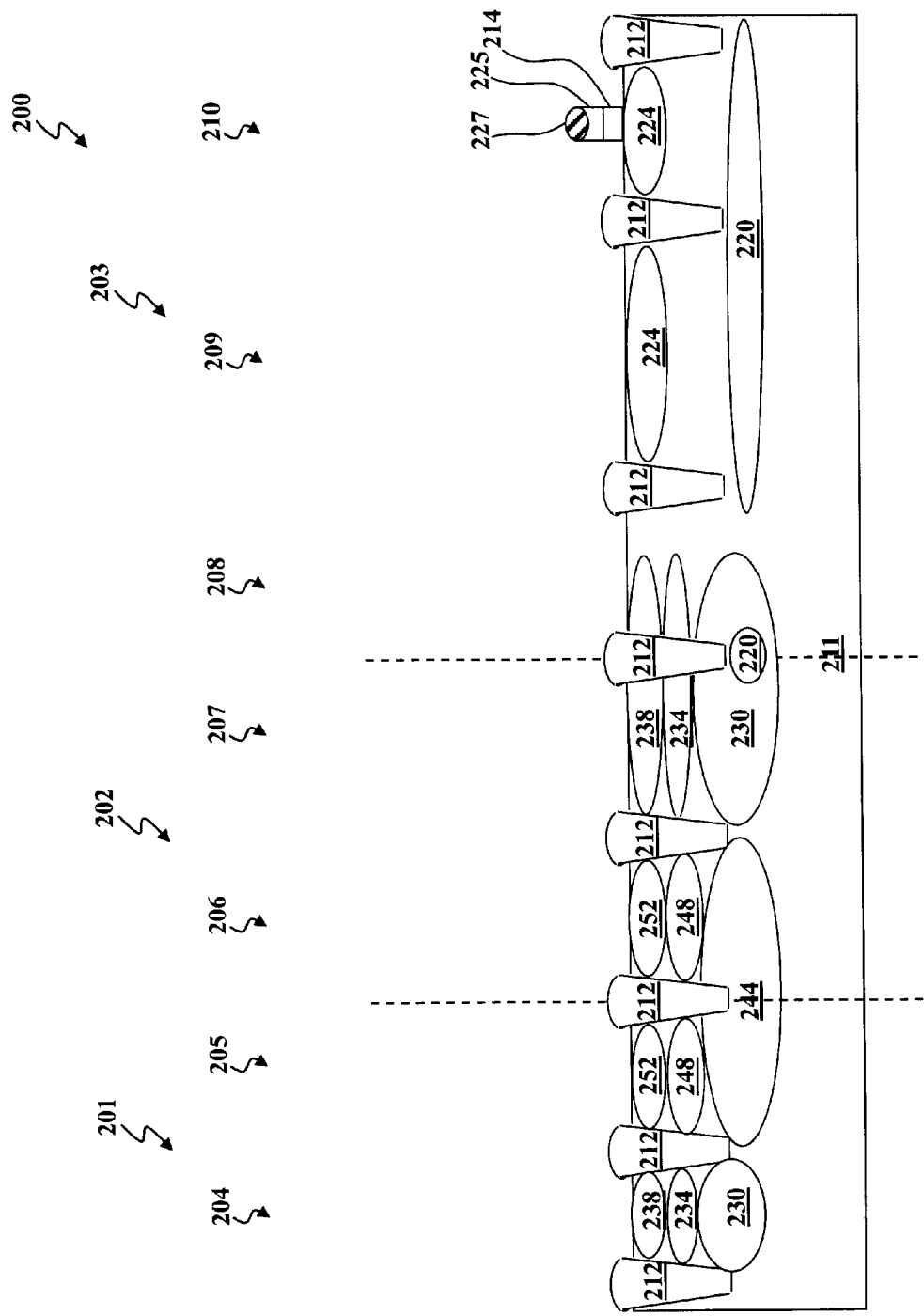

Referring to FIG. 14, the third patterned mask layer 240 is removed by any suitable process. For example, the third patterned mask layer 240 may be removed by a liquid "stripper", which chemically alters the third patterned mask layer 240 so that it no longer adheres to the insulating layer 214. Alternatively, third patterned mask layer 240 may be removed by a plasma containing oxygen, which oxidizes it, or any suitable process.

After removing the third patterned mask layer 240, the insulating layer 214 is removed by any suitable process. As an example, the insulating layer 214 is removed by an etching process. The etching process may include wet etching, dry etching, or a combination thereof. In one example, a wet etching process used to remove the insulating layer 214 includes a chemistry of hydrofluoric acid (HF).

Figure 15:
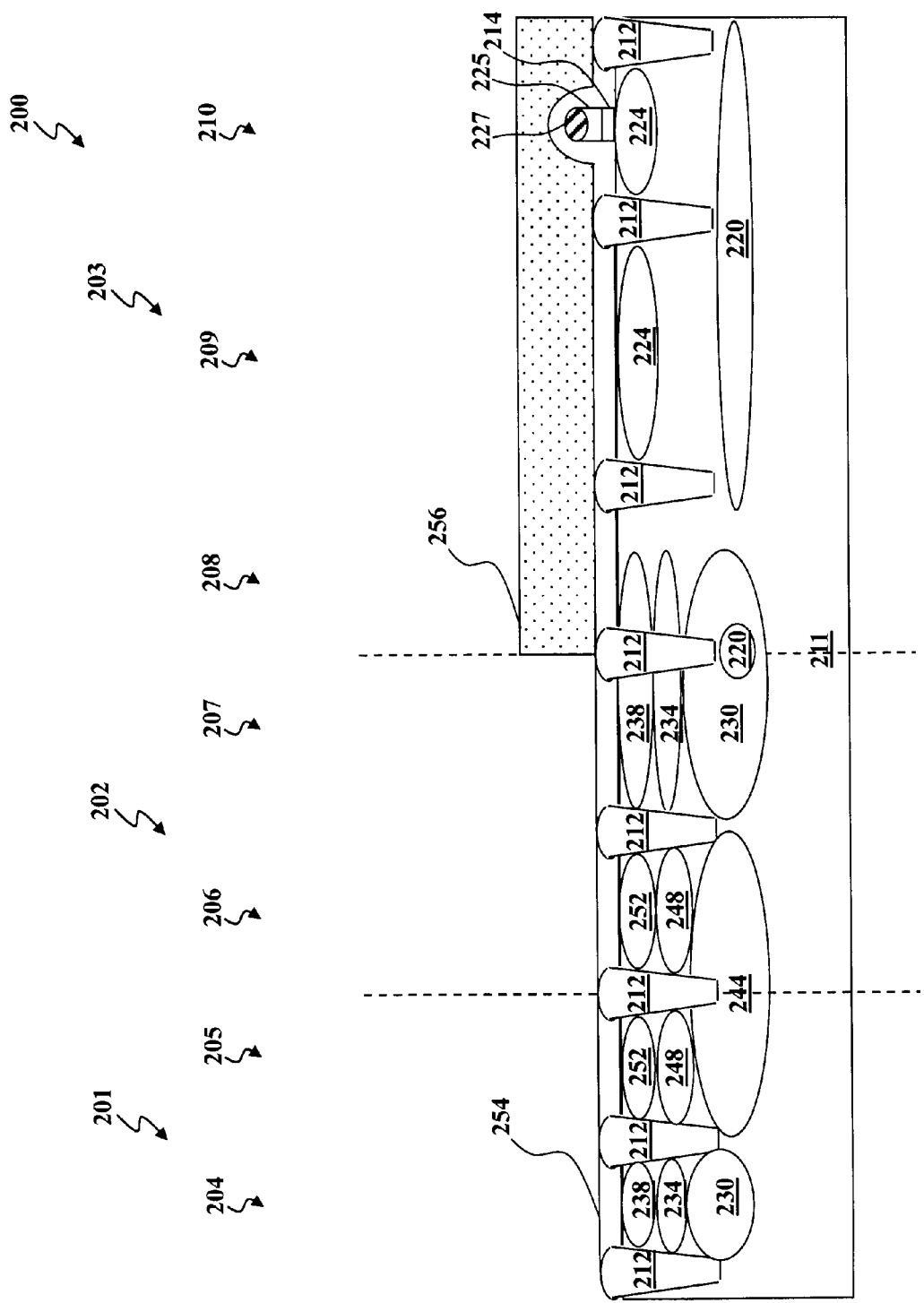

Referring to FIG. 15, an insulating layer 254 is formed over the substrate 211 and over the thick oxide 227. The insulating layer 254 may be formed to any suitable thickness. For example, the thickness of the insulating layer 254 may range from about 50 angstroms to about 250 angstroms. In the present embodiment, the insulating layer 254 has a thickness of about 200 angstroms. The insulating layer 254 may include a dielectric such as include silicon oxide, a high-k dielectric layer such as $HfO_2$, $TiO_2$, $HfZrO$, $Ta_2O_3$, $HfSiO_4$, $ZrO_2$, $ZrSiO_2$, combinations thereof, or other suitable material. or any suitable material. The insulating layer 214 may be formed by any suitable process such as chemical vapor deposition (CVD), physical vapor deposition (PVD), atomic layer deposition (ALD), high density plasma CVD (HDPCVD), plating, other suitable methods, and/or combinations thereof.

After forming the insulating layer 254 a fourth patterned mask layer 256 is formed over the substrate 210. The fourth patterned mask layer 256 is formed by depositing a photoresist, performing an exposure process to define the pattern of the mask layer 256, and developing the exposed photoresist such that the fourth patterned mask layer 256 remains only over the high voltage device regions 203. Alternatively, the fourth patterned mask layer 256 may be formed by depositing a hard mask, depositing a photoresist over the hard mask, exposing the photoresist to define a pattern, developing the photoresist, and etching the hard mask with the patterned photoresist.

Figure 16:
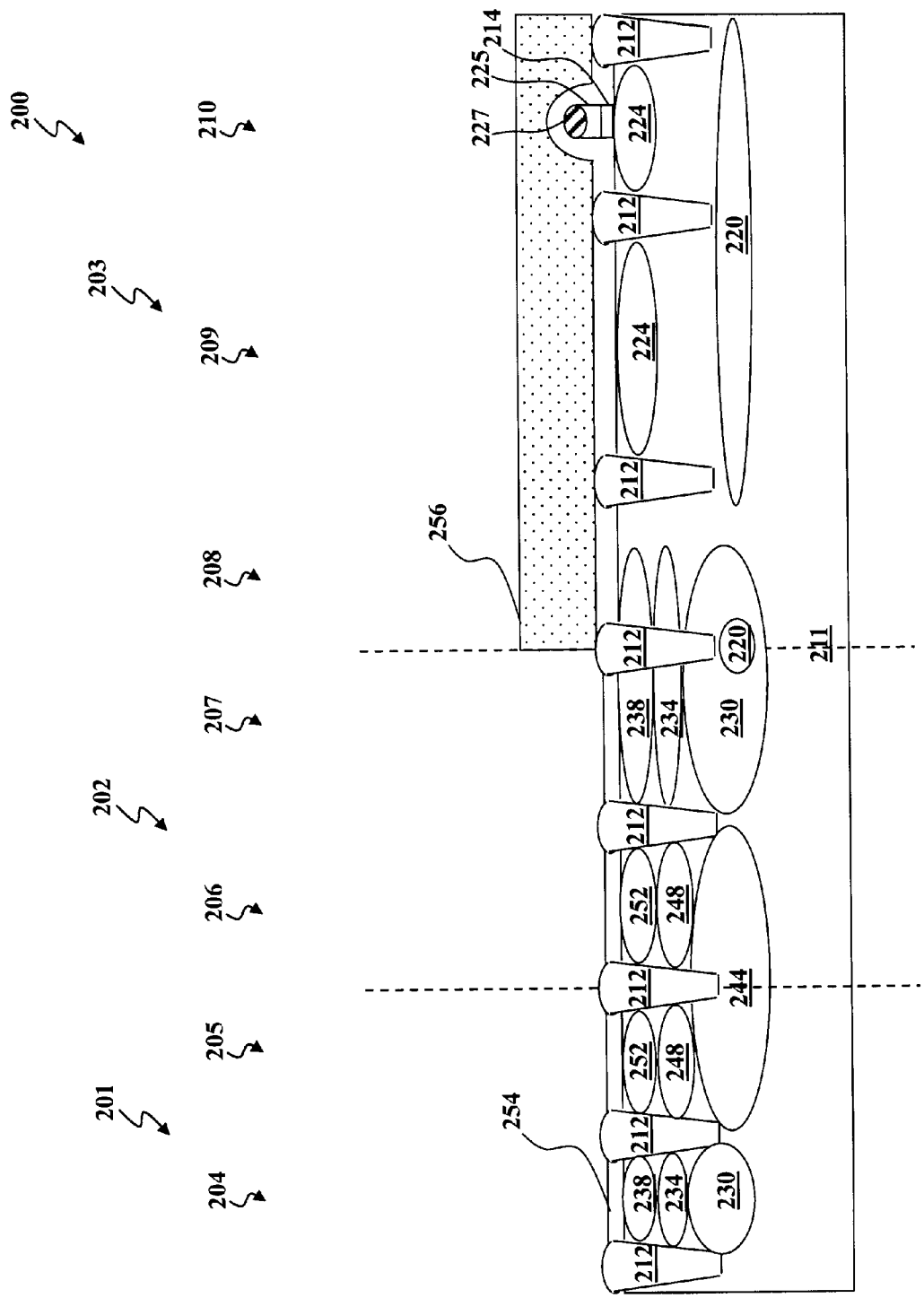

Referring to FIG. 16, after forming the fourth patterned mask layer 256, an etching process is performed to remove part of the insulating layer 254 over the low voltage device regions 210 and over the medium voltage device regions 202. As an example, part of the insulating layer 254 is removed by an etching process. The etching process may include wet etching, dry etching, or a combination thereof. In one example, a wet etching process used to remove part of the insulating layer 254 includes a chemistry of hydrofluoric acid (HF). Removing part of the insulating layer 254 reduces the thickness of the insulating layer 254 from about 200 angstroms to about 115 angstroms. It is understood that the etching process may be performed to reduce the thickness of the insulating layer 254 to any amount, depending on design requirements.

Figure 17:
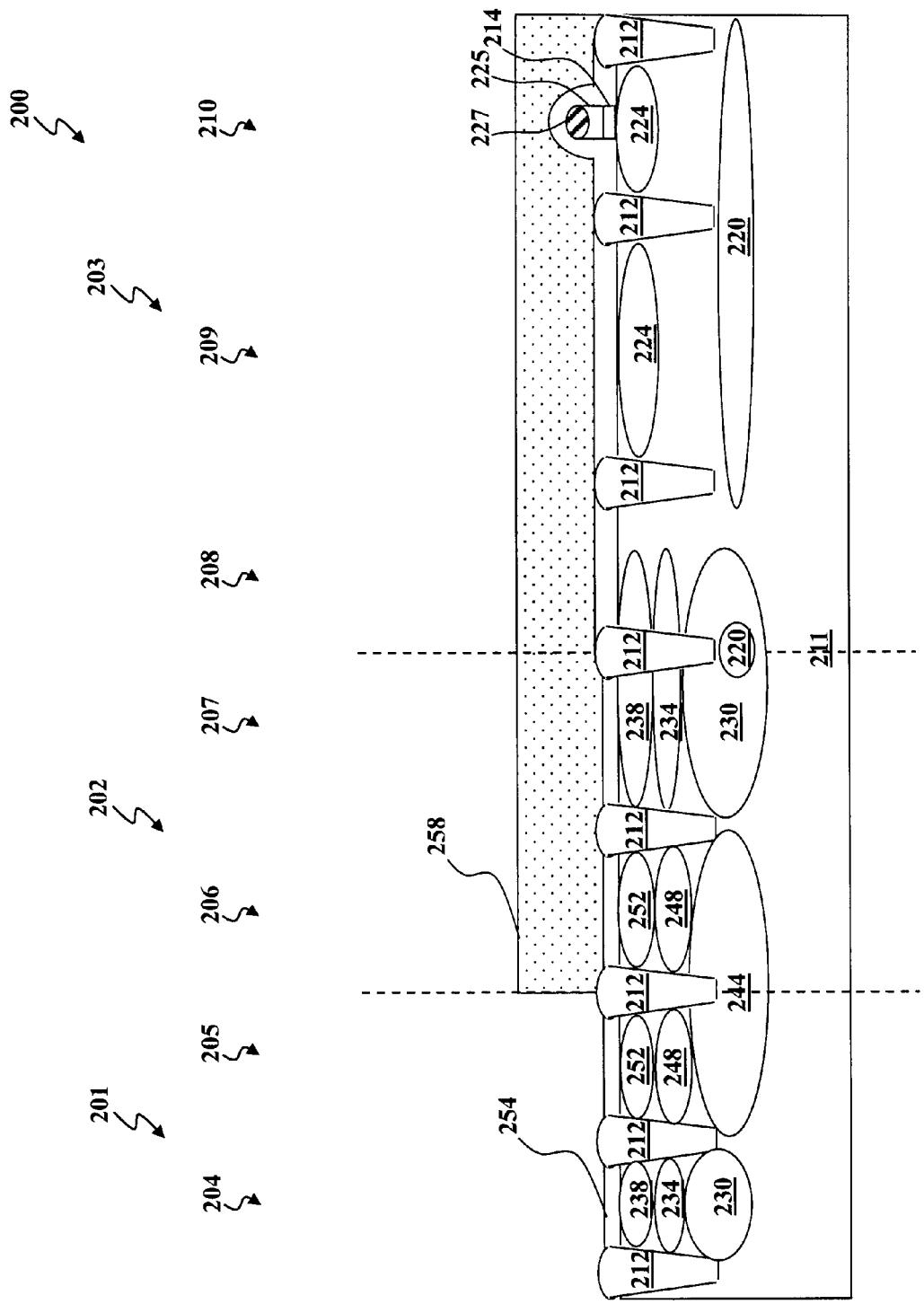

Referring to FIG. 17, the fourth patterned mask layer 256 is removed by any suitable process. For example, the fourth patterned mask layer 256 may be removed by a liquid "stripper", which chemically alters the fourth patterned mask layer 256 so that it no longer adheres to the insulating layer 254. Alternatively, the fourth patterned mask layer 256 may be removed by a plasma containing oxygen, which oxidizes it, or any suitable process.

After removing the fourth patterned mask layer 256, a fifth patterned mask layer 258 is formed over the substrate 210. The fifth patterned mask layer 258 is formed by depositing a photoresist, performing an exposure process to define the pattern of the fifth patterned mask layer 258, and developing the exposed photoresist such that fifth patterned mask layer 258 remains over the medium and high voltage device regions 202, 203. Alternatively, the fifth patterned mask layer 258 may be formed by depositing a hard mask, depositing a photoresist over the hard mask, exposing the photoresist to define a pattern, developing the photoresist, and etching the hard mask with the patterned photoresist.

Figure 18:
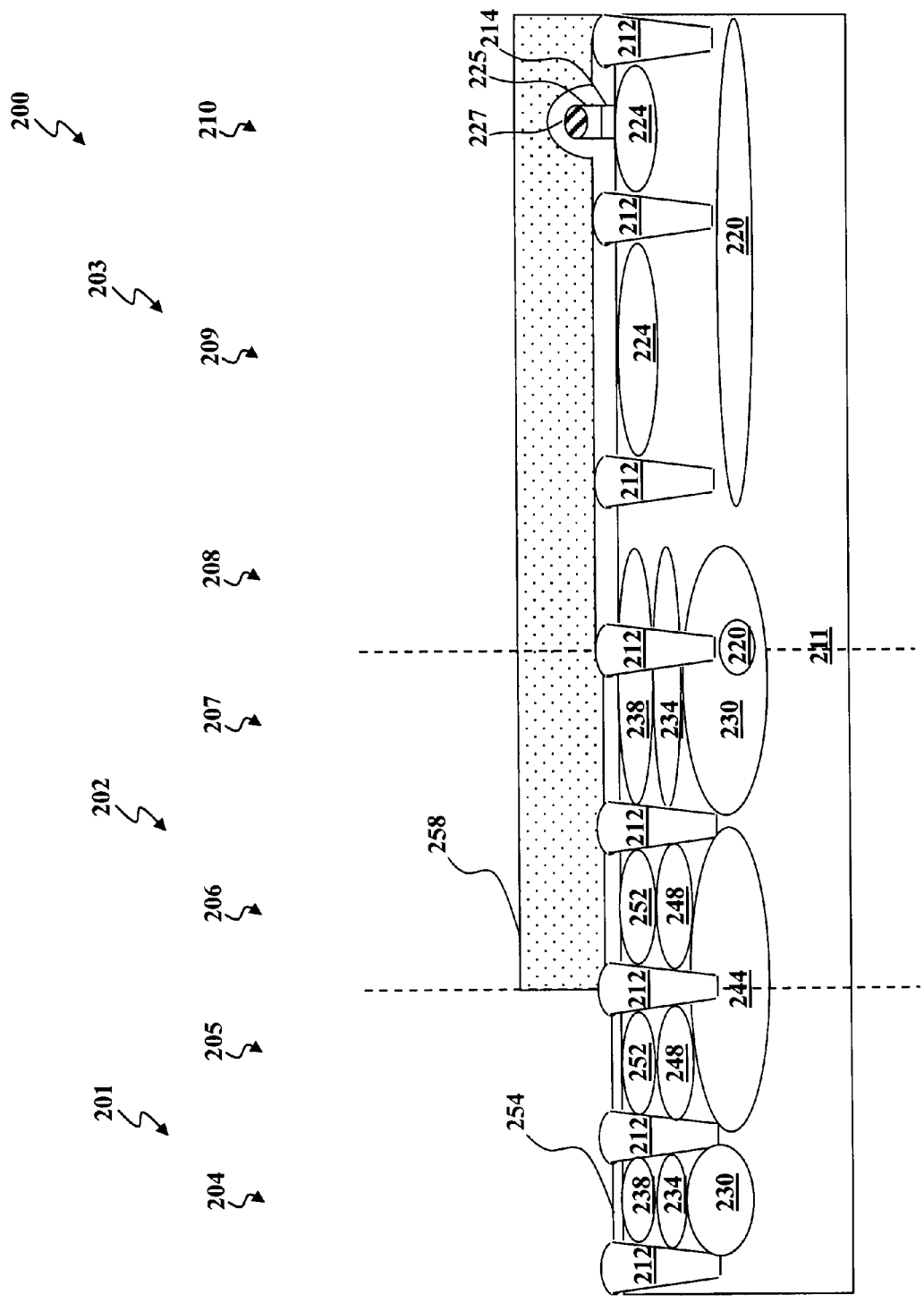

Referring to FIG. 18, after forming the fifth patterned mask layer 258, an etching process is performed to further remove part of the insulating layer 254 over the low voltage device regions 210. As an example, part of the insulating layer 254 is removed by an etching process. The etching process may include wet etching, dry etching, or a combination thereof. In one example, a wet etching process used to remove part of the insulating layer 254 includes a chemistry of hydrofluoric acid (HF). Removing part of the insulating layer 254 reduces the thickness of the insulating layer 254 from about 115 angstroms to about 32 angstroms. In alternative embodiments, a final thickness of the insulating layer 254 in the low voltage device regions 201 ranges from about 40 angstroms to about 25 angstroms, the insulating layer 254 in the medium voltage device regions 202 ranges from about 75 angstroms to about 65 angstroms, and the insulating layer 254 in the high voltage device regions 203 ranges from about 205 angstroms to about 175 angstroms. It is understood that the etching process may be performed to reduce the thickness of the insulating layer 254 to any amount, depending on design requirements.

Figure 19:
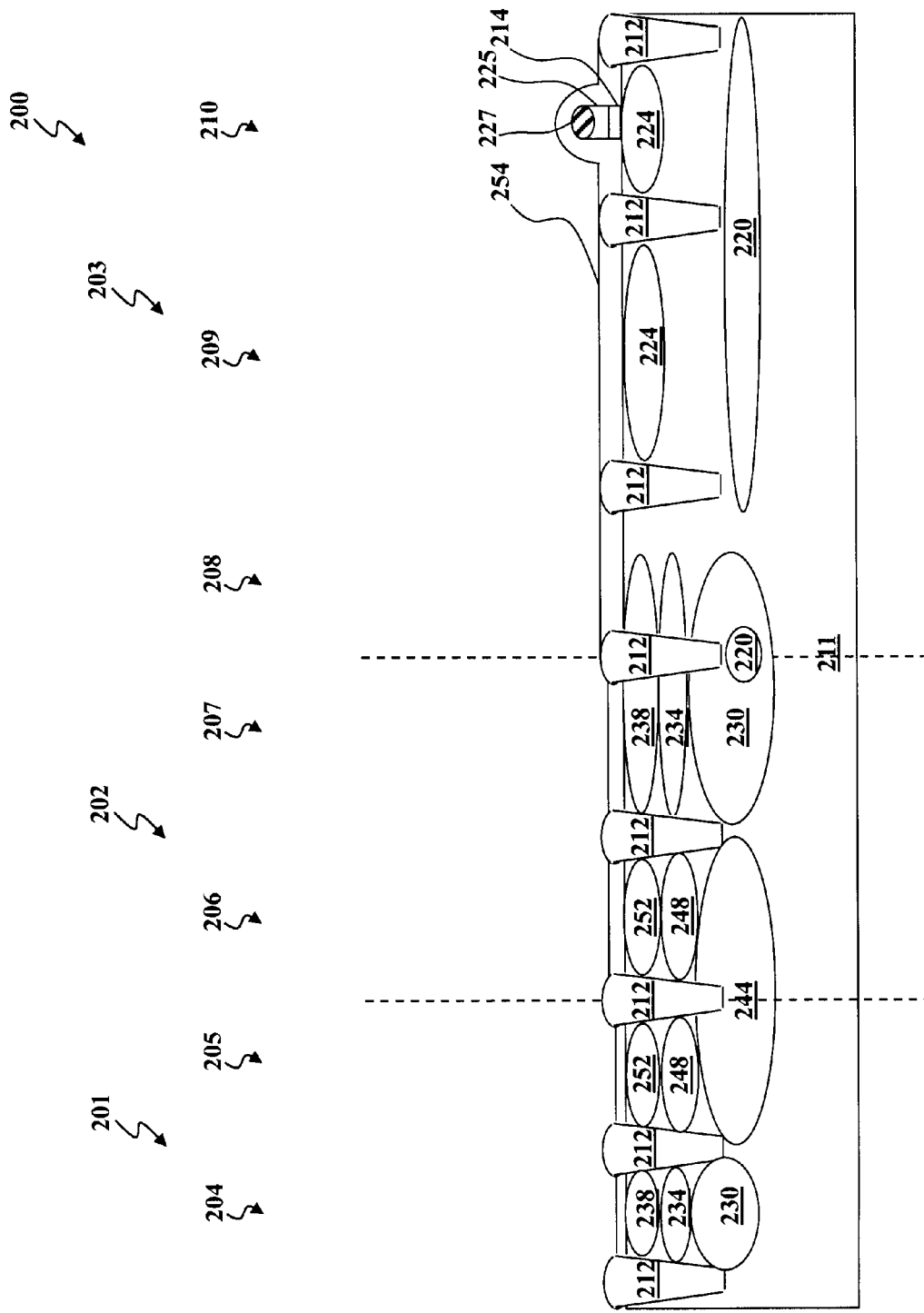

Referring to FIG. 19, the fifth patterned mask layer 258 is removed by any suitable process. For example, the fifth patterned mask layer 258 may be removed by a liquid "stripper", which chemically alters the fifth patterned mask layer 258 so that it no longer adheres to the insulating layer 254. Alternatively, the fifth patterned mask layer 258 may be removed by a plasma containing oxygen, which oxidizes it, or any suitable process.

Figure 20:
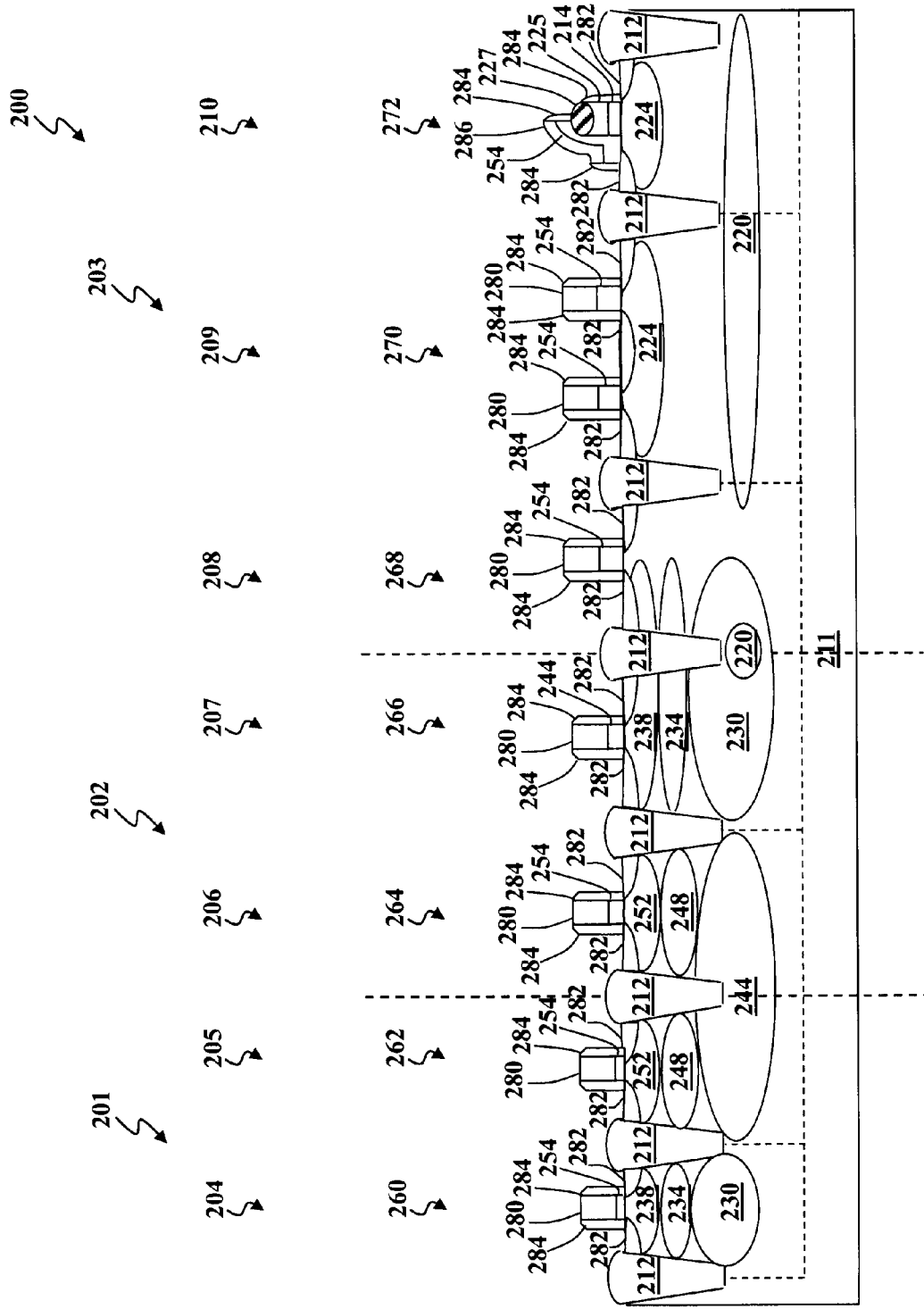
Figure 21:
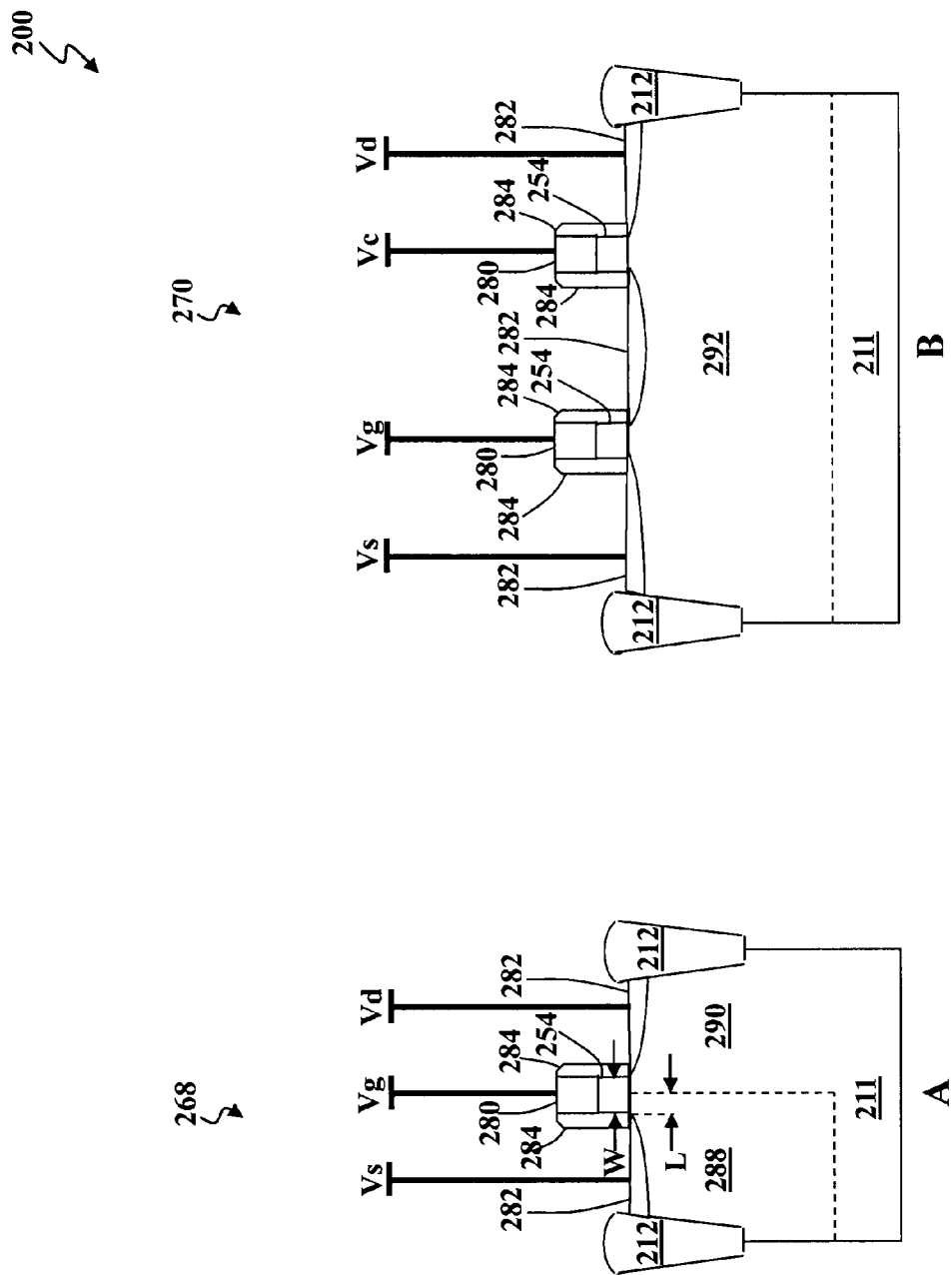

Referring to FIG. 20, various devices are further formed on the substrate 211. In the low voltage device regions 201 a LV-NMOS device 260 is formed in the LV-NMOS device region 204 and a LV-PMOS device 262 is formed in the LV-PMOS device region 205. In the medium voltage device regions 202 a MV-PMOS device 264 is formed in the LV-PMOS device region 206 and a LV-NMOS device 266 is formed in the LV-NMOS device region 207. In the high voltage device region 203 a HV-NMOS 268 is formed in the high voltage (HV) NMOS device region 208, a cascade HV-NMOS device 270 is formed in the cascade HV-NMOS device region 209, and a flash device 272 is formed in the flash device region 210.

Forming the various devices (i.e., LV-NMOS device 260, LV-PMOS device 262, MV-PMOS device 264, MV-NMOS device 266, HV-NMOS device 268 and cascade HV-NMOS device 270) includes forming a gate electrode 280 over the insulating layer 254, removing the insulating layer 254 over source and drain regions 282 of the various devices, and forming spacers 284 on sidewalls of the gate electrode 280. The source and drain features 282 of the various devices may include heavy doped regions and lightly doped regions having a dopant type opposite from the doping type of the doped substrate 211, such that the device is properly configured. Specifically, where the substrate 211 has been doped with p-type dopants the source and drain features 282 are doped with n-type dopants and where the substrate 211 has been doped with n-type dopants the source drain features 282 are doped with p-type dopants.

Forming the flash device 272 includes forming a contact 286 over the insulating layer 254, removing the insulating layer 254 over source and drain regions 282 of the flash device 272, and forming spacers 284 on sidewalls of the floating gate 225 and the contact 286. The source and drain features 282 are doped with p-type dopants.

Referring to FIG. 21A, a HV-NMOS device 268 is illustrated for discussion purposes. As illustrated, the HV-NMOS device 268 has a first doped region 288 that results from some or all of the ion implantations described above and a second doped region 290 that is part of the substrate 211. The first doped region 288 has a graded doping concentration and the second doped region has a uniform doping concentration. The first doped region 288 extends a longitudinal distance L under the gate electrode 280 within a channel region of the semiconductor device 200 and interfaces with the second doped region 290. The first doped region 288 may extend a longitudinal distance L within the channel region from about 0.3 nm to about 0.7 nm, depending on design requirements. The gate structure (which includes the gate electrode 280 and the insulating layer 254) has a width W. As a percentage of the gate structure width W, the first doped region 288 may extend a longitudinal distance L (under the gate structure and within the channel region) from about 30% to about 70%, depending on design requirements. In the present embodiment, the gate structure has a width W of about 1 um and the first doped region 288 extends a distance L of about 0.4 um under the gate electrode 280 and within the channel region.

During operation, a gate voltage (Vg), which varies, is applied to the gate electrode 280. A source voltage (Vs) is applied to the source and drain feature 282 on the first doped region 288 side and a drain voltage (Vd) is applied to the source and drain feature 282 on the opposite side. The structure of the HV-NMOS device provides for high breakdown voltage (e.g., 14 volts) and low current (e.g., 1 mA/um). The breakdown voltage may be adjusted/tuned by changing, for example, the width W of the gate structure and/or the distance L that the first doped region 288 extends under the gate structure.

Referring to FIG. 21B, a cascade HV-NMOS device 270 is illustrated for discussion purposes. As illustrated, the cascade HV-NMOS device 270 has two cascading gate structures (which include gate electrodes 280 and the insulating layer 254). The two cascading gate structures are formed over a doped region 292 that results from some or all of the ion implantations described above. The doped region 292 may have a graded doping concentration.

During operation, a gate voltage (Vg), which varies, is applied to one gate electrode 280 and a constant voltage (Vc) is applied to the other gate electrode 280. In the present embodiment, for example, the constant voltage (Vc) is 5 volts. In alternative embodiments, the constant voltage (Vc) is a different voltage value. The source voltage (Vs) is applied to the source and drain feature 282 near the gate electrode that receives the Vg. The drain voltage (Vd) is applied to the source and drain feature 282 on the opposite side, which is near the gate electrode that receives the constant voltage (Vc). The center source and drain region 282 that is formed between the two gate electrodes 280 and which is common to both, is not provided with a voltage signal (i.e., floating). The structure of the cascade HV-NMOS device provides for high breakdown voltage (e.g., 14 volts) and low current (e.g., 1 mA/um).

The disclosed semiconductor device 200 may include additional features, which may be formed by subsequent processing. For example, subsequent processing may further form various contacts/vias/lines and multilayer interconnect features (e.g., metal layers and interlayer dielectrics) on the substrate, configured to connect the various devices, features, and structures of the semiconductor device 200. The additional features may provide electrical interconnection to the semiconductor device 200. For example, a multilayer interconnection includes vertical interconnects, such as conventional vias or contacts, and horizontal interconnects, such as metal lines. The various interconnection features may implement various conductive materials including copper, tungsten, and/or silicide.

The disclosed semiconductor device 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others.

The above method 100 provides for an improved process to form a semiconductor device including various devices on a single substrate, thereby improving overall device performance and reducing manufacturing cost when compared with traditional manufacturing processes. For example, because the low voltage devices, medium voltage devices, and high voltage devices are formed with common masks and implantation processes, multiple steps of forming masks and implanting separate devices are avoided. Also, because the low voltage devices, medium voltage devices, and high voltage devices are integrated on a single substrate the semiconductor device has an overall higher performance. Further, the method 100 provides a HV-NMOS device and a cascade HV-NMOS device that have new structure and allow for improved functionality. Furthermore, the methods described herein can be easily implemented into current manufacturing process and technology, thereby lowering cost and minimizing complexity. Different embodiments may have different advantages, and no particular advantage is necessarily required of any embodiment.

Thus, provided is a semiconductor device. The exemplary multilayer device includes a substrate including a metal oxide device. The metal oxide device includes first and second doped regions disposed within the substrate and interfacing in a channel region. The first and second doped regions are doped with a first type dopant. The first doped region has a different concentration of dopant than the second doped region. The metal oxide device further includes a gate structure traversing the channel region and the interface of the first and second doped regions and separating source and drain regions. The source region is formed within the first doped region and the drain region is formed within the second doped region. The source and drain regions are doped with a second type dopant. The second type dopant is opposite of the first type dopant.

In some embodiments, the substrate includes a cascade metal oxide device, the cascade metal oxide device including: a first gate structure traversing a first channel region and separating first source and drain regions; a second gate structure traversing a second channel region and separating second source and drain regions; and a common source and drain region disposed between the first gate structure and the second gate structure, the common source and drain region including the drain region of the first source and drain region and the source region of the second source and drain region, wherein the cascade metal oxide device is separated from the metal oxide device by an isolation feature. In various embodiments, the first doped region includes a graded doping concentration, and the second doped region includes a uniform doping concentration. In certain embodiments, the first dopant type is a p-type, and the second dopant type is a n-type. In other embodiments, the first dopant type is a n-type, and the second dopant type is a p-type. In some embodiments, the first doped region has a length that extends longitudinally from about 0.3 um to about 0.6 um within the channel region. In various embodiments, the gate structure includes a gate dielectric and a gate electrode, and the gate dielectric ranges from about 100 angstroms to about 200 angstroms.

Also provided is an alternative embodiment of a semiconductor device. The semiconductor device includes a substrate including first and second portions. The semiconductor device further includes a first gate structure disposed in the first portion of the substrate. The first gate structure traverses a first channel region and separates first source and drain regions. The semiconductor device further includes a second gate structure disposed in the first portion of the substrate. The second gate structure traverses a second channel region and separates second source and drain regions. The semiconductor device further includes a common source and drain region disposed between the first gate structure and the second gate structure. The common source and drain region includes the drain region of the first source and drain regions and the source region of the second source and drain regions.

In some embodiments, the semiconductor device further includes a third gate structure disposed in the second portion of the substrate. The third gate structure traverses a third channel region and separates third source and drain regions. The semiconductor device further includes a first doped region extending within the third channel region. The semiconductor device further includes a second doped region extending within the third channel region. The second doped region has a different concentration of a dopant than the first doped region. The semiconductor device further includes a generally vertically extending interface area within the third channel region where the first doped region and the second doped region meet. The first portion and the second portion are separated by an isolation feature.

In some embodiments, the first gate structure is configured to receive a varying voltage, the second gate structure is configured to receive a constant voltage, the source region of the first source and drain regions is configured to receive a varying voltage, and the drain region of the second source and drain regions is configured to receive a varying voltage. In various embodiments, the source region of the third source and drain regions is disposed within a first doped region, the drain region of the third source and drain regions is disposed within the second doped region, the first doped region includes a graded doping concentration, and the second doped region includes a uniform doping concentration. In certain embodiments, the first and second source and drain regions are disposed within a doped region, the doped region includes a graded doping concentration, the doped region is doped with a first type dopant, the first and second source and drain regions are doped with a second type dopant, and the first type dopant is different from the second type dopant.

Also provided is a method of forming a semiconductor device. The exemplary method includes providing a substrate including low voltage, medium voltage, and high voltage regions. The method further includes forming a first patterned mask over the substrate. The method further includes implanting first portions of the high voltage region with a first type dopant using the first patterned mask. The method further includes forming a second patterned mask over the substrate. The method further includes implanting second portions of the low voltage, medium voltage, and high voltage device regions with a second type dopant using the second patterned mask. The method further includes forming a third patterned mask over the substrate. The method further includes implanting third portions of the low voltage and medium voltage device regions with a third type dopant using the third patterned mask.

In some embodiments, the method further includes forming a low voltage insulating layer in the low voltage region; forming a medium voltage insulating layer in the medium voltage region; and forming a high voltage insulating layer in the high voltage region. In various embodiments, the method further includes forming a plurality of devices over the low voltage insulating layer in the low voltage region; forming a plurality of devices over the medium voltage insulating layer in the medium voltage region; and forming a plurality of devices over the high voltage insulating layer in the high voltage region.

In some embodiments, the plurality of devices over the high voltage insulating layer includes a high voltage metal oxide device, a cascade high voltage metal oxide device, and a memory cell device. In various embodiments, the first type dopant and the second type dopants are the same type, and the first type dopant is opposite from the third type dopant. In certain embodiments, the first type dopant and the second type dopants are the same type, the first type dopant is a p-type, and the third dopant type is a n-type. In further embodiments, the low voltage insulating layer includes a thickness of less than about 32 angstroms, the medium voltage insulating layer includes a thickness of less than about 115 angstroms, and the high voltage insulating layer includes a thickness of less than about 200 angstroms.

Also provided is another method of forming a semiconductor device. The exemplary method includes providing a substrate including first and second portions. The method further includes forming a first doped region within the first portion. The method further includes forming a second doped region within the first portion, the first and second doped regions meeting within a first channel region at a generally vertically extending interface area, the first and second doped regions being doped with a first type dopant, the first doped region having a different concentration of dopant than the second doped region. The method further includes forming a gate structure over the first portion, the gate structure traversing the first channel region and separating first source and drain regions, the source region of the first source and drain regions being formed within the first doped region and the drain region of the first source and drain regions being formed within the second doped region, the first source and drain regions being doped with a second type dopant, the second type dopant being opposite of the first type dopant.

In some embodiments, the method further includes forming a third doped region within the second portion. The method further includes forming a second gate structure within the second portion, the second gate structure traversing a second channel region and separating second source and drain regions formed within the third doped region. The method further includes forming a third gate structure disposed in the second portion, the third gate structure traversing a third channel region and separating third source and drain regions formed within the third doped region. The method further includes forming a common source and drain region between the second gate structure and the third gate structure, the common source and drain region including the drain region of the second source and drain regions and the source region of the third source and drain regions.

In some embodiments, the first doped region includes a graded doping concentration, the second doped region includes a uniform doping concentration, the third doped region includes a graded concentration, the third doped region is doped with the first type dopant, and the second and third source and drain regions are doped with the second type dopant. In various embodiments, the second gate structure is configured to receive a varying voltage, the third gate structure is configured to receive a constant voltage, the source region of the second source and drain regions is configured to receive a varying voltage, and the drain region of the third source and drain regions is configured to receive a varying voltage. In certain embodiments, the first dopant type is a p-type, and the second dopant type is a n-type. In other embodiments, the first dopant type is a n-type, and the second dopant type is a p-type. In further embodiments, the first doped region extends longitudinally under the first gate structure from about 30% to about 60% of a width of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a metal oxide device over a substrate, wherein
        forming the metal oxide device includes:

forming a first and second doped regions disposed within the substrate, the first and second doped regions interfacing in a channel region, the first region underlying a first shallow trench isolation (STI) feature and the second doped region underlying a second STI feature, the first and second doped regions being doped with a first type dopant, the first doped region having a different concentration of dopant than the second doped region; and forming a gate structure traversing the channel region and the interface of the first and second doped regions and separating source and drain regions, the source region being formed within the first doped region and the drain region being formed within the second doped region, the source and drain regions being doped with a second type dopant, the second type dopant being complementary to the first type dopant.

2. The method of claim 1 further comprising forming a cascade metal oxide device over the substrate, wherein forming the cascade metal oxide device includes:
   forming a first gate structure traversing a first channel region and separating first source and drain regions;
   forming a second gate structure traversing a second channel region and separating second source and drain regions; and
   forming a common source and drain region disposed between the first gate structure and the second gate structure, the common source and drain region including the drain region of the first source and drain region and the source region of the second source and drain region,
   wherein the cascade metal oxide device is separated from the metal oxide device by the STI feature.

3. The method of claim 1 wherein the first doped region includes a graded doping concentration, and
   wherein the second doped region includes a uniform doping concentration.

4. The method of claim 1 wherein the first type dopant is a p-type, and
   wherein the second type dopant is a n-type.

5. The method of claim 1 wherein the first type dopant is a n-type, and
   wherein the second type dopant is a p-type.

6. The method of claim 1 wherein the first doped region has a length that extends longitudinally from about 0.3 um to about 0.6 um within the channel region.

7. The method of claim 1 wherein the gate structure includes a gate dielectric and a gate electrode, and
   wherein the gate dielectric ranges from about 100 angstroms to about 200 angstroms.

8. A method comprising:
   forming a first gate structure in a first portion of a substrate, the first gate structure traversing a first channel region and separating first source and drain regions;
   forming a second gate structure in the first portion of the substrate, the second gate structure traversing a second channel region and separating second source and drain regions;
   forming a third gate structure in a second portion of the substrate, the third gate structure traversing a third channel region and separating third source and drain regions;
   forming first and second doped regions within the third channel region, the second doped region having a different concentration of a dopant than the first doped region, the first and second doped regions having a generally vertically extending interface area where they meet, the vertically extending interface area extending within the substrate being deeper than an isolation feature that separates the first portion and the second portion of the substrate.

9. The method of claim 8 further comprising forming a common source and drain region between the first gate structure and the second gate structure, the common source and drain region including the drain region of the first source and drain regions and the source region of the second source and drain regions.

10. The method of claim 8 wherein the first gate structure is configured to receive a varying voltage,
    wherein the second gate structure is configured to receive a constant voltage,
    wherein the source region of the first source and drain regions is configured to receive a varying voltage, and
    wherein the drain region of the second source and drain regions is configured to receive a varying voltage.

11. The method of claim 8 wherein the source region of the third source and drain regions is disposed within a first doped region,
    wherein the drain region of the third source and drain regions is disposed within the second doped region,
    wherein the first doped region includes a graded doping concentration, and
    wherein the second doped region includes a uniform doping concentration.

12. The method of claim 8 wherein the first and second source and drain regions are disposed within a doped region,
    wherein the doped region includes a graded doping concentration,
    wherein the doped region is doped with a first type dopant,
    wherein the first and second source and drain regions are doped with a second type dopant, and
    wherein the first type dopant is different from the second type dopant.

13. A method of manufacturing comprising:
    forming a first patterned mask over a substrate including low voltage, medium voltage, and high voltage regions;
    implanting first portions of the high voltage region with a first type dopant using the first patterned mask;
    forming a second patterned mask over the substrate;
    implanting second portions of the low voltage, medium voltage, and high voltage regions with a second type dopant using the second patterned mask such that a generally vertically extending interface extending within the substrate is formed deeper than an isolation feature that separates the medium voltage region and the high voltage region of the substrate;
    forming a third patterned mask over the substrate; and
    implanting third portions of the low voltage and medium voltage regions with a third type dopant using the third patterned mask.

14. The method of claim 13 further comprising:
    forming a low voltage insulating layer in the low voltage region;
    forming a medium voltage insulating layer in the medium voltage region; and
    forming a high voltage insulating layer in the high voltage region.

15. The method of claim 14 further comprising:
    forming a plurality of devices over the low voltage insulating layer in the low voltage region;
    forming a plurality of devices over the medium voltage insulating layer in the medium voltage region; and
    forming a plurality of devices over the high voltage insulating layer in the high voltage region.

16. The method of claim 15 wherein the plurality of devices over the high voltage insulating layer includes a high voltage metal oxide device, a cascade high voltage metal oxide device, and a memory cell device.

17. The method of claim 13 wherein the first type dopant and the second type dopants are the same type, and
   wherein the first type dopant is opposite from the third type dopant.

18. The method of claim 13 wherein the first type dopant and the second type dopants are the same type,
   wherein the first type dopant is a p-type, and
   wherein the third dopant type is a n-type.

19. The method of claim 14 wherein the low voltage insulating layer includes a thickness of less than about 32 angstroms,
   wherein the medium voltage insulating layer includes a thickness of less than about 115 angstroms, and
   wherein the high voltage insulating layer includes a thickness of less than about 200 angstroms.

20. The method of claim 13 wherein implanting second portions of the low voltage, medium voltage, and high voltage regions with a second type dopant using the second patterned mask includes forming graded doping concentration regions within the substrate in the low voltage, medium voltage, and high voltage regions.

* * * * *